(12) United States Patent
Koike et al.

(10) Patent No.: US 7,071,028 B2
(45) Date of Patent: Jul. 4, 2006

(54) SEMICONDUCTOR DEVICE AND ITS MANUFACTURING METHOD

(75) Inventors: Toshihiko Koike, Aichi (JP); Manabu Honda, Aichi (JP); Masuo Kato, Aichi (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 10/381,633

(22) PCT Filed: Jun. 14, 2002

(86) PCT No.: PCT/JP02/05977

§ 371 (c)(1),
(2), (4) Date: Sep. 9, 2003

(87) PCT Pub. No.: WO03/012868

PCT Pub. Date: Feb. 13, 2003

(65) Prior Publication Data

US 2004/0036164 A1    Feb. 26, 2004

(30) Foreign Application Priority Data

Jul. 31, 2001 (JP) ............................. 2001-231381
Jan. 15, 2002 (JP) ............................... 2002-5836

(51) Int. Cl.
*H01L 21/44* (2006.01)
*H01L 21/48* (2006.01)
*H01L 21/50* (2006.01)
*H01L 23/02* (2006.01)

(52) U.S. Cl. ...................... 438/107; 438/110; 438/127; 438/690; 438/FOR. 385

(58) Field of Classification Search ................ 438/112, 438/124, 126, 127, 459, 977, 107, 110, 690, 438/FOR. 385

See application file for complete search history.

(56) References Cited

U.S. PATENT DOCUMENTS 5,925,934 A * 7/1999 Lim ........................... 257/778

(Continued)

FOREIGN PATENT DOCUMENTS

JP    2000-183283 A1    6/2000

(Continued)

OTHER PUBLICATIONS

Takuya et al. Mounting Structure Of Semiconductor Device, Laminated Circuit Module, And Method Of manufacturing Semiconductor Device Mounting Structure (Jun. 22, 2001) (Japan Publication No. 2001-168269, translation).*

*Primary Examiner*—W. David Coleman
*Assistant Examiner*—Khiem Nguyen
(74) *Attorney, Agent, or Firm*—Lerner, David, Littenberg, Krumholz & Mentlik, LLP

(57) ABSTRACT

A semiconductor device in which a semiconductor chip (3) is mounted on a substrate (2), comprising a substrate having electrodes (7, 8) for substrate-to-substrate connection disposed on both sides of the substrate and connected via a through hole (9), a semiconductor chip having an electrode connected to a wiring pattern arranged on the substrate and having a flat-cut face opposite to the face where the electrode is provided, a bump (4) for substrate-to-substrate connection provided on the electrode for substrate-to-substrate connection and having a flat-cut face opposite to the face facing the substrate, a sealing resin body (5) provided on the substrate, used for sealing the semiconductor chip and the bump for substrate-to-substrate, and having a flat-cut face opposite to the face facing the substrate, wherein the flat-cut face (3a) of the semiconductor chip, the flat-cut face (4a) of the bump for substrate-to-substrate, and the flat-cut face (5a) or the sealing resin body are flush with one another, and the semiconductor chip and the bump for disk recording medium except for the flat-cut faces are scaled in the sealing body.

14 Claims, 32 Drawing Sheets

U.S. PATENT DOCUMENTS

| | | | |
|---|---|---|---|
| 6,188,127 B1* | 2/2001 | Senba et al. | 257/686 |
| 6,399,423 B1* | 6/2002 | Matsuura et al. | 438/123 |
| 6,498,392 B1* | 12/2002 | Azuma | 257/676 |
| 6,548,330 B1* | 4/2003 | Murayama et al. | 438/127 |
| 6,590,276 B1* | 7/2003 | Matsuura et al. | 257/666 |
| 6,759,268 B1* | 7/2004 | Akagawa | 438/106 |
| 6,774,467 B1* | 8/2004 | Horiuchi et al. | 257/673 |
| 6,897,097 B1* | 5/2005 | Matsuura et al. | 438/123 |
| 2001/0041424 A1* | 11/2001 | Matsuura et al. | 438/461 |
| 2002/0017710 A1* | 2/2002 | Kurashima et al. | 257/686 |
| 2004/0040740 A1* | 3/2004 | Nakatani et al. | 174/256 |

FOREIGN PATENT DOCUMENTS

| | | |
|---|---|---|
| JP | 2000-340736 A1 | 12/2000 |
| JP | 2001-144218 A1 | 5/2001 |
| JP | 2001-168269 A1 | 6/2001 |

* cited by examiner

SEMICONDUCTOR DEVICE AND ITS MANUFACTURING METHOD

TECHNICAL FIELD

The present invention relates to a semiconductor device and a method for manufacturing it, and more particularly to a layered semiconductor device and a method for manufacturing it.

BACKGROUND ART

In recent electronic devices, arrangements to realize compact forms and higher functions of them have been made. In order to make the electronic devices compact and obtain the higher functions of them, it has been demanded to mount semiconductor devices of large capacity with small mounting areas and small mounting volume as much as possible.

For instance, in the electronic device using a semiconductor memory, an attempt has been made to make the device more compact with the increase of an amount of treated information. As the amount of information handled by the electronic device increases, it has been also demanded not only to increase the capacity of the semiconductor memory used for storing the information, but also to make the semiconductor memory mounted in the electronic device compact so as to meet the compact electronic device. In other words, the mounting area and the mounting volume of the semiconductor memory to be mounted in the electronic device have been desired to be decreased.

Thus, there has been proposed various kinds of semiconductor devices in which a plurality of semiconductor memories are combined to increase the storage capacity. FIGS. 1 to 3 show one example of such semiconductor devices.

In the semiconductor device shown in FIGS. 1 to 3, a semiconductor chip 101 forming a semiconductor memory is firstly prepared. The back surface of the semiconductor chip 101, that is, a surface 102 opposite to a surface on which a connecting terminal to a substrate is formed is ground to form a mounting semiconductor chip 103 whose thickness is reduced. The semiconductor chip 103 which is ground is reversed, that is, the semiconductor chip 103 is mounted on a substrate 104 with the ground surface used as a mounting surface, as shown in FIG. 1. On both the front and back surfaces of the substrate 104, are formed inter-substrate connecting electrodes 105 and 106 electrically connected to a wiring pattern to which the semiconductor chip 103 mounted on the substrate 104 is electrically connected. These inter-substrate connecting electrodes 105 and 106 are electrically connected to each other through through holes 107 opened on the substrate 104. On the inter-substrate connecting electrodes 105 formed on the surface on which the semiconductor chip 103 is mounted, solder bumps 108 with prescribed height are formed to form a semiconductor device 109 as shown in FIG. 2.

A plurality of the semiconductor devices 109 formed as shown in FIG. 2 are stacked so as to be layered and the solder bumps 108 are respectively connected to the inter-substrate connecting electrodes 106 so that a layered semiconductor device 110 as shown in FIG. 3 is formed.

As described above, the semiconductor chip 101 is ground to decrease the thickness so that the thickness of the layered semiconductor device 110 obtained by layering these semiconductor chips 101 in multiple stages can be reduced. The thickness of the layered semiconductor device 110 formed by layering a plurality of the above-described semiconductor devices 109 can be adequately reduced.

In the semiconductor device 109 used for the above-described layered semiconductor device 110, since the semiconductor chip 101 as a simple substance is ground to obtain the mounting semiconductor chip 103 whose thickness is reduced, a load exerted on the semiconductor chip 101 is large. Thus, there arises a great risk that cracks or the like may be possibly formed on the semiconductor chip 101 and the semiconductor chip 101 may be broken. Therefore, there is a limit to reduce the thickness of the semiconductor chip 101 and the thickness of the semiconductor chip is hardly reduced to a desire thickness.

In order to lighten the load exerted on the semiconductor chip 101 upon grinding, there may be considered a method that after the semiconductor chip 101 is mounted on the substrate, all the peripheral surface of the semiconductor chip 101 is completely covered with a synthetic resin for encapsulating, and then, the semiconductor chip 101 is ground together with the encapsulating resin. In such a manner, since the load exerted on the semiconductor chip upon grinding is distributed to the encapsulating resin, even when the semiconductor chip 101 is ground until its thickness is adequately decreases, the damage of the semiconductor chip 101 such as cracks can be avoided.

When all the surface of the outer periphery of the semiconductor chip 101 mounted on the substrate is covered with the encapsulating resin, the inter-substrate connecting electrodes 105 and 106 are also covered with the encapsulating resin. Accordingly, in order to layer the plural semiconductor chips 101, it is necessary to remove the encapsulating resin with which the inter-substrate connecting electrodes are covered by using a laser beam or the like, or form in the encapsulating resin holes reaching the inter-substrate connecting electrodes and fill the holes with soft solder. The holes have bottoms, and it is very difficult to fill the holes having the bottoms with the soft solder so as not to supply air bubbles to the holes. For instance, it is extremely difficult to supply the soft solder by a simple screen printing method.

DISCLOSURE OF THE INVENTION

It is an object of the present invention to provide a new semiconductor device capable of overcoming the above-described problems of the conventional semiconductor device, a layered semiconductor device using this semiconductor device and a method for manufacturing these semiconductor devices.

It is another object of the present invention to provide a semiconductor device which realizes a thinner device and can increase a capacity while realizing the thinner device, a layered semiconductor device using this semiconductor device and a method for manufacturing these semiconductor devices.

In order to overcome the above-described problems, a semiconductor device according to the present invention comprises: a substrate having inter-substrate connecting electrodes formed on both front and back surfaces and connected by through holes; a semiconductor chip having electrodes connected to a wiring pattern formed on the substrate and a surface opposite to an electrode forming surface cut flat; inter-substrate connecting bumps provided on the inter-substrate connecting electrodes on the substrate and having surfaces opposite to the substrate cut flat; and an encapsulating resin provided on the substrate to encapsulate the semiconductor chip and the inter-substrate connecting bumps and having surfaces opposite to the substrate cut flat, wherein the cut flat surface of the semiconductor chip, the cut flat surfaces of the inter-substrate connecting bumps and the cut flat surfaces of the encapsulating resin are located in the same plane and the semiconductor chip and the inter-substrate connecting bumps are encapsulated in the encapsulating resin except the cut flat surfaces.

In the semiconductor device according to the present invention proposed for achieving the above-described objects, since the semiconductor chip is cut together with the encapsulating resin to have a desired thickness, a load upon cutting is distributed to the encapsulating resin, and accordingly, the damage of the semiconductor chip such as cracks can be reduced and the semiconductor chip can be cut more to be thinner.

Further, since the inter-substrate connecting bumps are formed on the inter-substrate connecting electrodes, covered with the encapsulating resin and then cut together with the encapsulating resin to be exposed, there is no fear that the connection between the inter-substrate connecting bumps and the inter-substrate connecting electrodes may be possibly imperfect, and the connecting end faces of prescribed areas are formed.

In a layered semiconductor device according to the present invention having a plurality of semiconductor devices, each semiconductor device comprises: a substrate having inter-substrate connecting electrodes formed on both front and back surfaces and connected by through holes; a semiconductor chip having electrodes connected to a wiring pattern on the substrate on the front surface or both the front and back surfaces of the substrate and a surface opposite to an electrode forming surface on which the electrodes are formed cut flat; inter-substrate connecting bumps provided on the inter-substrate connecting electrodes on the front surface or both the front and back surfaces of the substrate and having surfaces opposite to the substrate cut flat; and an encapsulating resin provided on the front surface or both the front and back surfaces of the substrate to encapsulate the semiconductor chip and the inter-substrate connecting bumps and having surfaces opposite to the substrate cut flat. In the layered semiconductor device, are layered a plurality of semiconductor devices each of which has the cut flat surface of the semiconductor chip, the cut flat surfaces of the inter-substrate connecting bumps and the cut flat surfaces of the encapsulating resin located in the same plane and the semiconductor chip and the inter-substrate connecting bumps encapsulated in the encapsulating resin except the cut flat surfaces. The inter-substrate connecting bumps of the respective semiconductor devices are connected together or the inter-substrate connecting bumps are connected to the inter-substrate connecting electrodes.

In the layered semiconductor device according to the present invention, since a plurality of semiconductor devices having the semiconductor chips cut to be extremely thin can be layered, a compact and especially thin layered semiconductor device with more improved integration can be realized.

A method for manufacturing a semiconductor device according to the present invention comprises the steps of forming inter-substrate connecting bumps on one of a front surface or both of front and back surfaces of inter-substrate connecting electrodes formed on both the front and back surfaces of a substrate, connected by through holes and connected to a wiring pattern so as to be higher than required height; connecting electrodes of a semiconductor chip to the wiring pattern formed on the substrate and mounting the electrodes of the semiconductor chip on the front surface or both the front and back surfaces of the substrate; applying an encapsulating resin to the substrate so as to cover the semiconductor chip and the inter-substrate connecting bumps therewith; and cutting flat the surfaces of the encapsulating resin, the semiconductor chip and the inter-substrate connecting bumps opposite to the substrate so that the space between the cut flat surfaces of the encapsulating resin, the semiconductor chip and the inter-substrate connecting bumps and the substrate has a prescribed thickness.

In the method for manufacturing a semiconductor device according to the present invention, since the semiconductor chip is cut together with the encapsulating resin, stress exerted on the semiconductor chip upon cutting is decreased so that the damage of the semiconductor chip such as cracks is reduced and the semiconductor chip can be cut to be thinner.

Since the inter-substrate connecting bumps are previously applied to the inter-substrate connecting electrodes, then encapsulated by the encapsulating resin and the connecting end faces are exposed by cutting, the connected states of the inter-substrate connecting bumps and the inter-substrate connecting electrodes are not unstable and the connecting end faces of prescribed areas can be ensured. Thus, the connection between the respective semiconductor devices when a plurality of semiconductor devices are layered can be easily carried out.

Further, the inter-substrate connecting bump are applied to the inter-substrate connecting electrodes before the semiconductor chip is mounted on the substrate, so that there is no fear that a connecting material for connecting the semiconductor chip to the wiring pattern on the substrate may possibly flow out to the inter-substrate connecting electrodes to prevent the connection between the inter-substrate connecting electrodes and the inter-substrate connecting bumps or the connection between the substrates, and the inter-substrate connecting electrodes can be provided in positions near areas where the semiconductor chips are mounted and the compact semiconductor device, especially, a compact planar configuration can be realized.

A method for manufacturing a layered semiconductor device according to the present invention comprises the steps of: forming inter-substrate connecting bumps on one of a front surface or both of front and back surfaces of inter-substrate connecting electrodes formed on both the front and back surfaces of a substrate, connected by through holes and connected to a wiring pattern so as to be higher than required height; connecting electrodes of a semiconductor chip to the wiring pattern formed on the substrate and mounting the electrodes of the semiconductor chip on the front surface or both the front and back surfaces of the substrate; applying an encapsulating resin to the substrate so as to cover the semiconductor chip and the inter-substrate connecting bumps therewith; and cutting flat the surfaces of the encapsulating resin, the semiconductor chip and the inter-substrate connecting bumps opposite to the substrate to have the space of a prescribed thickness between the cut flat surfaces of the encapsulating resin, the semiconductor chip and the inter-substrate connecting bumps and the substrate so that each semiconductor device is formed; layering a plurality of semiconductor devices thus formed; and then, connecting the inter-substrate connecting bumps of the respective semiconductor devices together or the inter-substrate connecting bumps to the inter-substrate connecting electrodes.

In the method for manufacturing the layered semiconductor device, a plurality of semiconductor devices each of which has a semiconductor chip cut extremely thin can be layered so that a compact and, especially thin layered semiconductor device with high integration can be manufactured and the respective semiconductor devices can be connected together with high accuracy.

Another semiconductor device according to the present invention comprises a substrate having inter-substrate connecting electrodes formed on both front and back surfaces and connected by through holes; a semiconductor chip having electrodes connected to a wiring pattern formed on the substrate and a surface opposite to an electrode forming surface cut flat; inter-substrate connecting bumps provided on the inter-substrate connecting electrodes on the substrate and having surfaces opposite to the substrate cut flat after they are previously made to collapse to prescribed thickness; and a polymer material located so as to surround parts between the substrate and the semiconductor chip and the side surfaces of the semiconductor chip to secure the semiconductor chip to the substrate, and the cut flat surface of the semiconductor chip and the cut flat surfaces of the inter-substrate connecting bumps are located in the same plane. Since the semiconductor device is secured to the substrate by the polymer material located so as to surround the parts between the semiconductor chip and the substrate and the side surfaces of the semiconductor chip, load upon cutting is distributed to the polymer material and the substrate to decrease the damage of the semiconductor such as cracks, and accordingly, the semiconductor chip can be cut thinner.

Since the inter-substrate connecting bumps are made to collapse to prescribed thickness after they are formed on the inter-substrate connecting electrodes, and then, cut together with the semiconductor chip, there is no possibility that the connection between the inter-substrate connecting bumps and the inter-substrate connecting electrodes may be imperfect and the connecting end faces of prescribed areas are formed. Further, the inter-substrate connecting bumps are made to collapse so that the inter-substrate connecting bumps effectively come into contact the inter-substrate connecting electrodes and the substrate, and the inter-substrate connecting bumps may not possibly slip out of the substrate due to a cutting operation. Further, the inter-substrate connecting bumps are previously made to collapse to have a thickness near a final thickness, so that the cutting operation is easily carried out.

Another layered semiconductor device having a plurality of semiconductor devices according to the present invention, each semiconductor device comprises: a substrate having inter-substrate connecting electrodes formed on both front and back surfaces and connected by through holes; a semiconductor chip having electrodes connected to a wiring pattern formed on the substrate on the front surface or both the front and back surfaces of the substrate and a surface opposite to an electrode forming surface cut flat; inter-substrate connecting bumps provided on the inter-substrate connecting electrodes on the substrate and having surfaces opposite to the substrate cut flat after they are previously made to collapse to a prescribed thickness; and a polymer material located so as to surround parts between the substrate and the semiconductor chip and the side surfaces of the semiconductor chip to secure the semiconductor chip to the substrate, the cut flat surface of the semiconductor chip and the cut flat surfaces of the inter-substrate connecting bumps being located in the same plane to obtain each semiconductor device, and further layering the plural semiconductor devices thus formed, and the inter-substrate connecting bumps of the respective semiconductor devices are connected together or the inter-substrate connecting bumps are connected to the inter-substrate connecting electrodes. According to the present invention, a plurality of semiconductor devices each of which has the thin cut semiconductor chip can be layered, and accordingly, a compact and especially thin layered semiconductor device with high integration can be obtained.

Another method for manufacturing a semiconductor device according to the present invention comprises the steps of forming inter-substrate connecting bumps on one of a front surface or both of front and back surfaces of inter-substrate connecting electrodes formed on both the front and back surfaces of a substrate, connected by through holes and connected to a wiring pattern so as to be higher than required height and making the inter-substrate connecting bumps to collapse in the direction of the thickness of the substrate to have the height near the required height; connecting electrodes of a semiconductor chip to the wiring pattern formed on the substrate and mounting the electrodes of the semiconductor chip on the front surface or both the front and back surfaces of the substrate and securing the semiconductor chip to the substrate by a polymer material located so as to surround parts between the substrate and the semiconductor chip and the side surfaces of the semiconductor chip; and cutting flat the surfaces of the semiconductor chip and the inter-substrate connecting bumps opposite to the substrate to have the space of a prescribed thickness between the cut flat surfaces of the semiconductor chip and the inter-substrate connecting bumps and the substrate. According to the present invention, since the semiconductor chip is cut while the semiconductor chip is secured to the substrate by the polymer material, stress exerted on the semiconductor chip upon cutting is decreased so that the damage of the semiconductor chip such as cracks is decreased and the semiconductor chip can be cut thinner than a usual case.

Further, since the inter-substrate connecting bumps are temporarily made to collapse after they are previously applied to the inter-substrate connecting electrodes, and then cut, the inter-substrate connecting bumps do not slip off from the substrate due to a cutting operation, the connected states of the inter-substrate connecting bumps and the inter-substrate connecting electrodes are not unstable and the connecting end faces of prescribed areas can be ensured. Thus, when a plurality of semiconductor devices are layered, the semiconductors can be respectively easily connected together.

Still further, since the inter-substrate connecting bumps are applied to the inter-substrate connecting electrodes before the semiconductor chip is mounted on the substrate, there is no possibility that a connecting material used for connecting the semiconductor chip to the wiring pattern on the substrate flows out to the inter-substrate connecting electrodes to prevent the connection between the inter-substrate connecting electrodes and the inter-substrate connecting bumps or the connection between the substrates. Therefore, the inter-substrate connecting electrodes can be provided at positions near an area where the semiconductor chip is mounted and the semiconductor can be made compact and, especially, a planar configuration can be made compact.

Another method for method for manufacturing a layered semiconductor device comprises the steps of: forming inter-substrate connecting bumps on one of a front surface or both of front and back surfaces of inter-substrate connecting electrodes formed on both the front and back surfaces of a substrate, connected by through holes and connected to a wiring pattern so as to be higher than required height; making the inter-substrate connecting bumps to collapse in the direction of the thickness of the substrate to have the height near the required height; connecting electrodes of a semiconductor chip to the wiring pattern formed on the substrate and mounting the electrodes of the semiconductor chip on the front surface or both the front and back surfaces of the substrate and securing the semiconductor chip to the substrate by a polymer material located so as to surround parts between the substrate and the semiconductor chip and the side surfaces of the semiconductor chip; cutting flat the surfaces of the semiconductor chip and the inter-substrate connecting bumps opposite to the substrate to have the space of a prescribed thickness between the cut flat surfaces of the semiconductor chip and the inter-substrate connecting bumps and the substrate and to obtain each semiconductor device; layering a plurality of semiconductor devices thus obtained; and connecting the inter-substrate connecting bumps of the respective semiconductor devices together or connecting the inter-substrate connecting bumps to the inter-substrate connecting electrodes.

In another method for manufacturing a layered semiconductor device according to the present invention, the plural semiconductor devices each of which has a semiconductor chip cut extremely thinner than a usual semiconductor chip can be layered and a compact, and especially thin layered semiconductor device with high integration can be manufactured. Further, the semiconductor devices can be respectively connected together with high accuracy.

Still another objects of the present invention and specific advantages obtained by the present invention will be more apparent from below-describe embodiments.

BRIEF DESCRIPTION OF THE DRAWINGS

FIG. 1 shows a mounting step of a semiconductor chip, FIG. 2 shows a solder bump forming step and FIG. 3 shows a layered semiconductor device.

FIG. 8 shows a step of forming inter-substrate connecting bumps, FIG. 9 shows a step of forming stud bumps on electrodes for a chip, FIG. 10 shows a mounting step of a semiconductor chip, FIG. 11 shows an encapsulating step by an encapsulating resin and FIG. 12 shows a grinding step.

FIG. 13 shows a step of forming inter-substrate connecting bumps, FIG. 14 shows a step of forming stud bumps on electrodes for a chip on one surface of a substrate, FIG. 15 shows a step of mounting a semiconductor chip on one surface of the substrate, FIG. 16 shows an encapsulating step on one surface of the substrate by an encapsulating resin, FIG. 17 shows a step of forming stud bumps on electrodes for a chip on the other surface of the substrate, FIG. 18 shows a state in which an encapsulating step of the other surface of the substrate is completed, FIG. 19 shows a cutting step of one surface of the substrate and FIG. 20 shows a cutting step of the other surface of the substrate.

FIG. 26 shows a step of applying inter-substrate connecting bumps to a substrate, FIG. 27 shows a step of making the inter-substrate connecting bumps to collapse so as to have a prescribed thickness, FIG. 28 shows a step of mounting electrodes on semiconductor chips, FIG. 29 shows a step of mounting the semiconductor chips on the substrate, FIG. 30 shows a step of mounting the semiconductor chips on the substrate to achieve a conduction and FIG. 31 shows a grinding step.

BEST MODE FOR CARRYING OUT THE INVENTION

Figure 1:
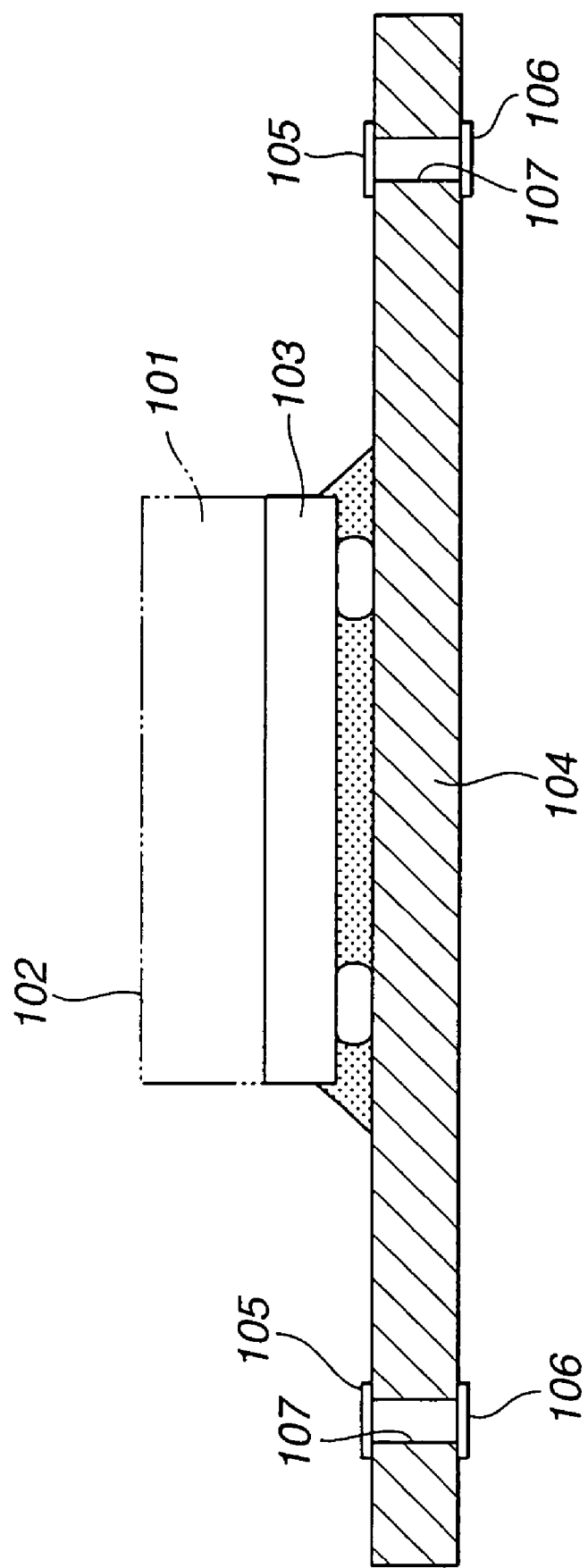
FIGS. 1 to 3 are sectional views showing one example of a method for manufacturing a conventional semiconductor device and a layered semiconductor device.
Figure 2:
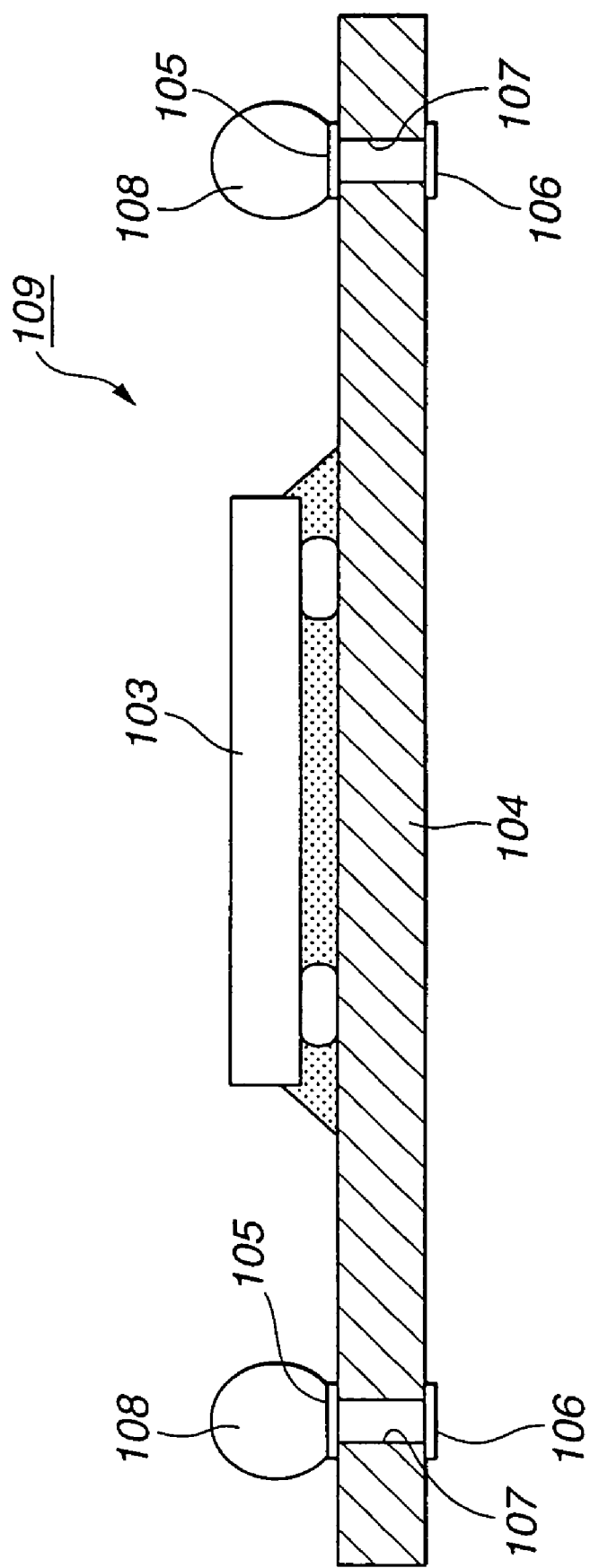
Figure 3:
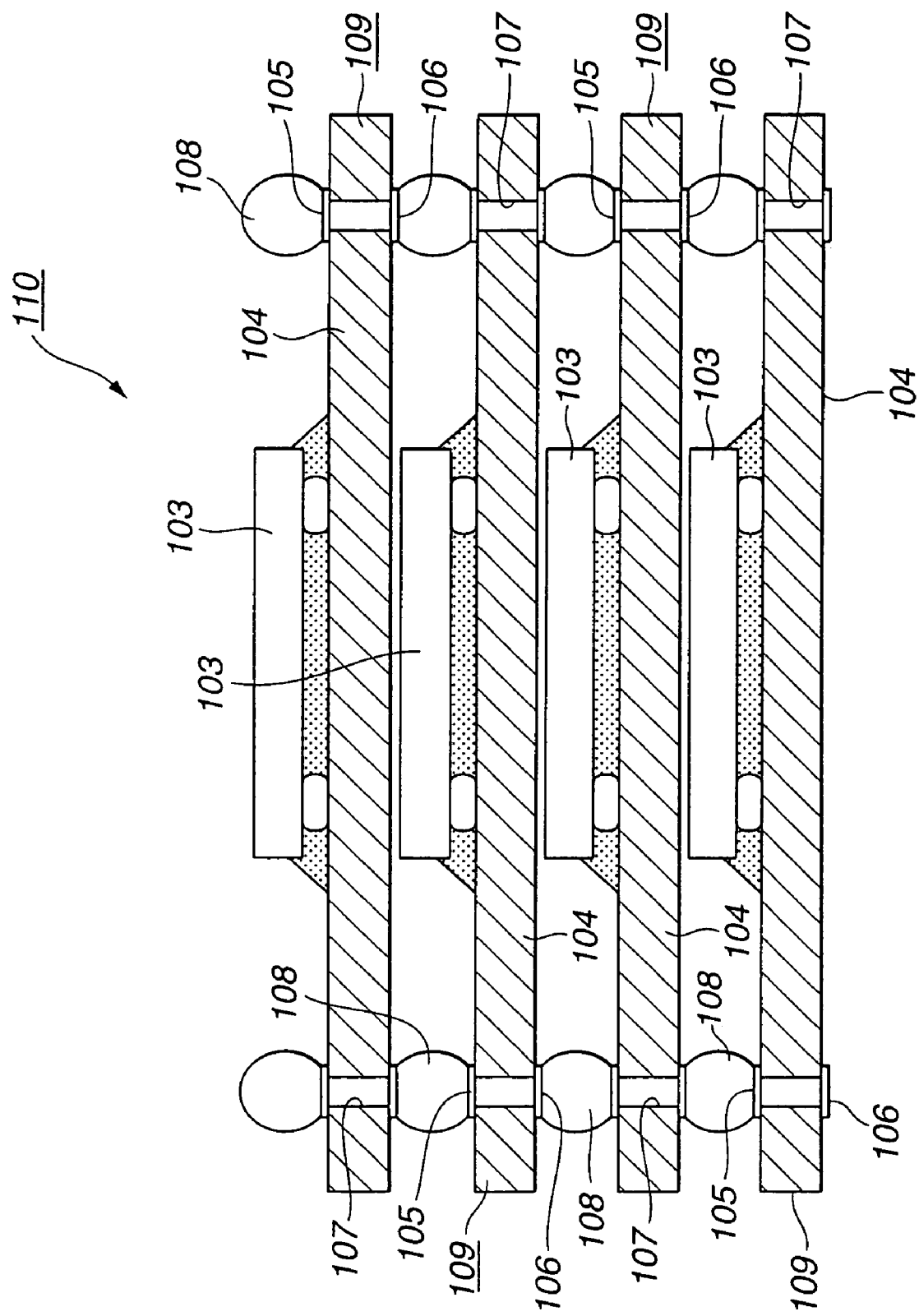

Now, embodiments of a semiconductor device, a layered semiconductor device, methods for manufacturing the semiconductor device and the layered semiconductor device will be described by referring the drawings.

Firstly, a first embodiment of the semiconductor device according to the present invention will be described by referring to FIG. 4. A semiconductor device shown in FIG. 4 has a substrate 2. On one surface side 2a of the substrate 2, a semiconductor chip 3 is mounted and inter-substrate connecting bumps 4 are provided. The semiconductor chip 3 and the inter-substrate connecting bumps 4 mounted on the substrate 2 are encapsulated by an encapsulating resin 5. The surfaces of the semiconductor chip 3, the inter-substrate connecting bumps 4 and the encapsulating resin 5 opposite to the substrate 2, that is, surfaces facing the front surface side of the semiconductor 1 in FIG. 4 serve as cut flat surfaces 3a, 4a and 5a, respectively. The cut flat surfaces 3a, 4a and 5a are all cut so as to be located in the same plane.

Figure 4:
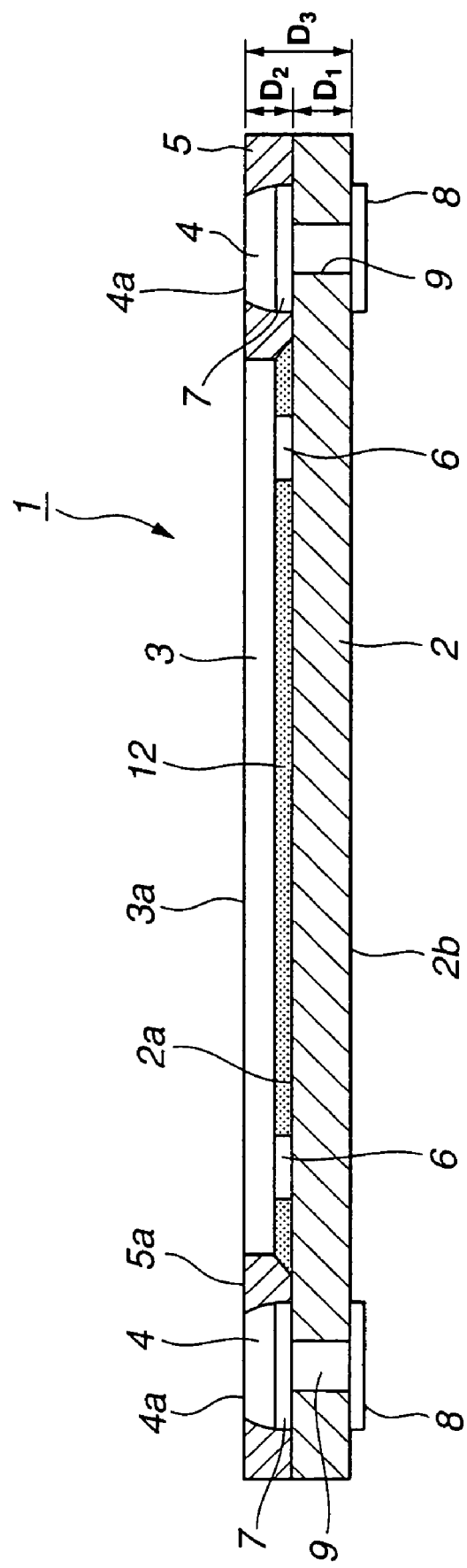
FIG. 4 is a schematic sectional view showing a first embodiment of a semiconductor device according to the present invention.

In the semiconductor device 1 shown in FIG. 4, the thickness $D_1$ of the substrate 2 ranges from 100 m to 150 m. The thickness $D_2$ from one surface 2a of the substrate 2 to the respective cut flat surfaces 3a, 4a and 5a is about 50 m and an entire thickness $D_3$ ranges from about 150 m to 200 m.

Subsequently, a second embodiment of the semiconductor device according to the present invention will be described by referring to FIG. 5. In a semiconductor device 1A shown in FIG. 5, a semiconductor chip 3 is mounted on the other surface side 2b of a substrate 2 as well as one surface side 2a and inter-substrate connecting bumps 4 are provided. That is, in the semiconductor device 1A, the semiconductor chips 3 are mounted and the inter-substrate connecting bumps 4 are provided on both the surfaces of the substrate 2. Also in this semiconductor device 1A, the semiconductor chip 3 and the inter-substrate connecting bumps 4 mounted on the other surface side 2b of the substrate 2 are encapsulated by an encapsulating resin 5 and the surfaces of the semiconductor chip 3, the inter-substrate connecting bumps 4 and the encapsulating resin 5 facing surface sides are all cut flat surfaces 3a, 4a and 5a, respectively so as to be located in the same plane.

Figure 5:
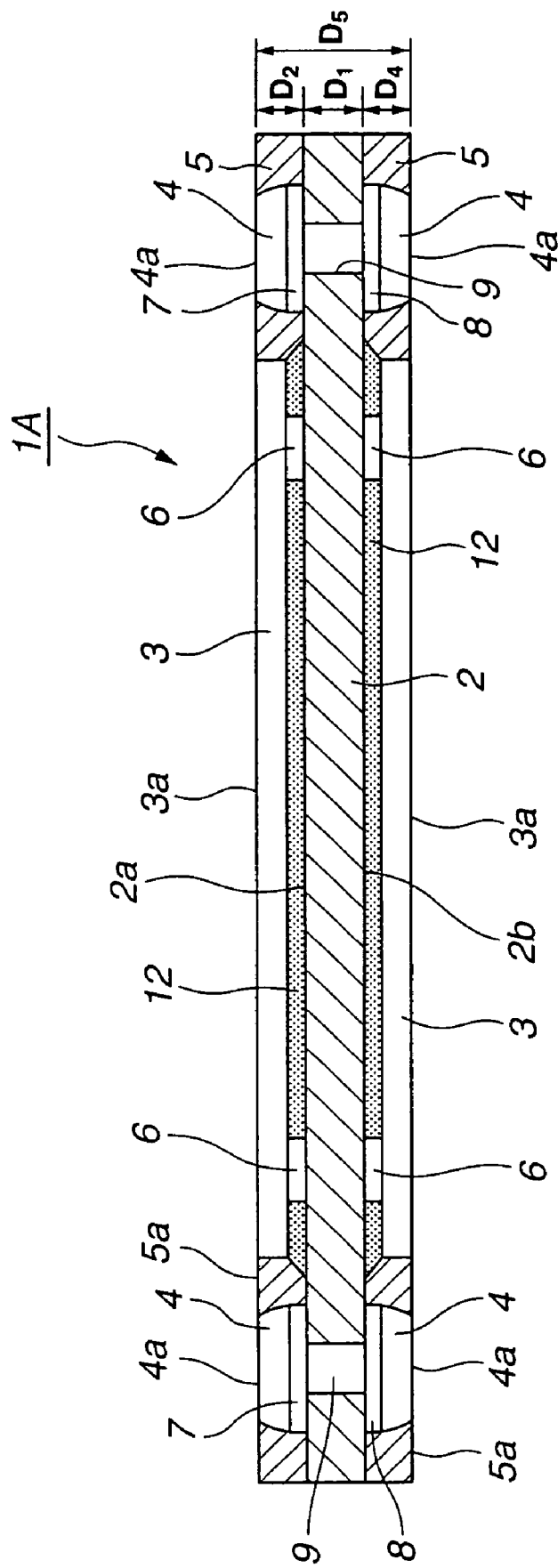
FIG. 5 is a schematic sectional view showing a second embodiment of the semiconductor device according to the present invention.

In the semiconductor device 1A shown in FIG. 5, the thickness $D_1$ of the substrate 2 ranges from 100 m to 150 m. The thickness $D_2$ from one surface 2a of the substrate 2 to the respective cut flat surfaces 3a, 4a and 5a is about 50 m, the thickness $D_4$ from the other surface 2b of the substrate 2 to the respective cut flat surfaces 3a, 4a and 5a is about 50 m and an entire thickness $D_5$ ranges from about 150 m to 200 m.

Now, a first embodiment of a layered semiconductor device according to the present invention will be described by referring to FIG. 6.

Figure 6:
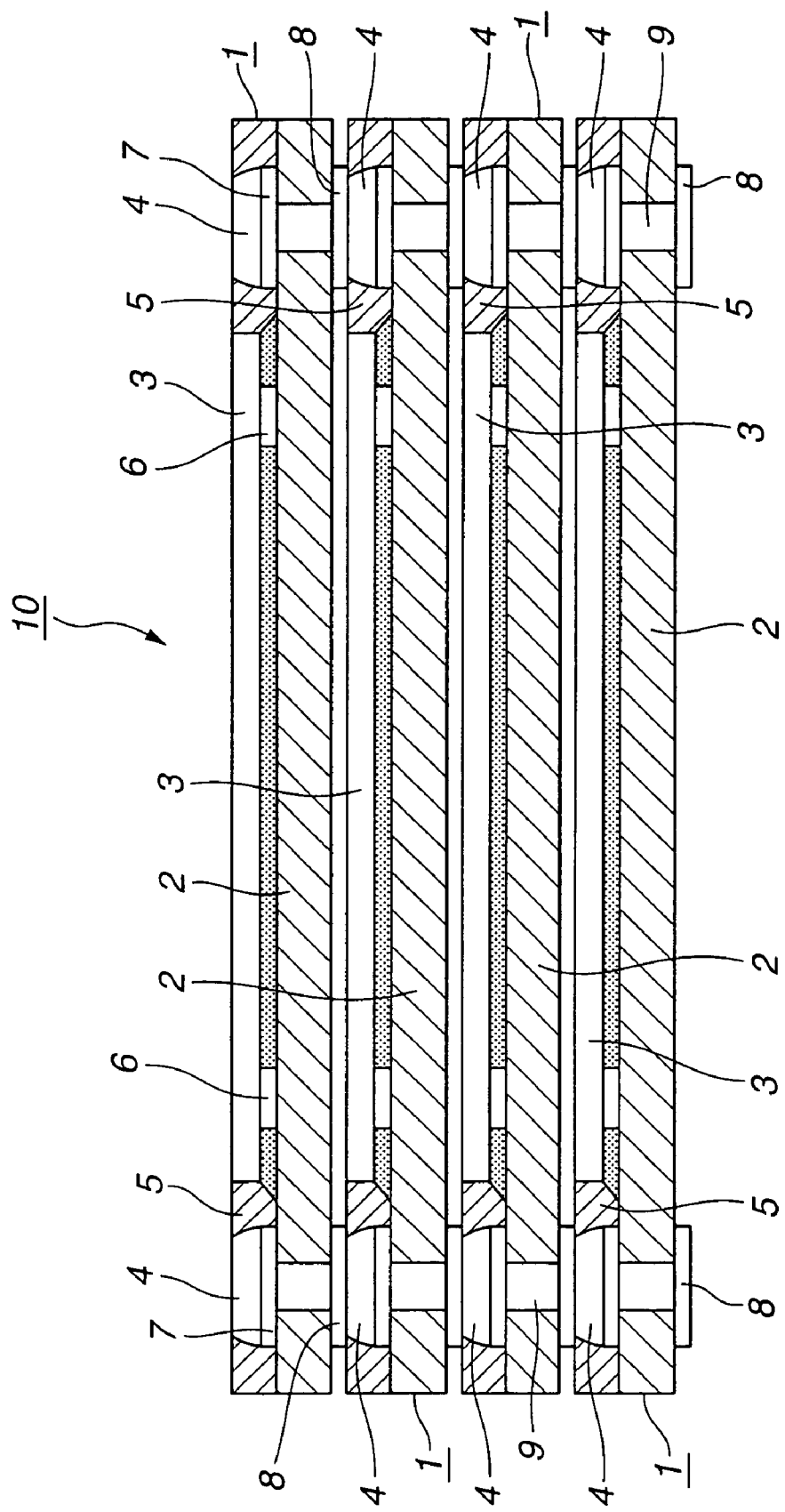
FIG. 6 is a schematic sectional view showing a first embodiment of a layered semiconductor device according to the present invention.

The layered semiconductor device 10 according to the present invention shown in FIG. 6 is formed by layering the four semiconductor devices 1 shown in FIG. 4.

In the layered semiconductor device 10, for instance, solder is applied to the cut flat surfaces 4a of the inter-substrate connecting bumps 4 of the semiconductor device 1 located in a first layer, lower inter-substrate connecting electrodes 8 of the semiconductor device 1 forming a second layer are superposed on the applied solder, and the semiconductor device 1 forming a third layer and the semiconductor device 1 forming a fourth layer are sequentially superposed thereon in the same manner. Then, the solder applied to parts between the semiconductor devices 1 is melted by reflow soldering, so that the inter-substrate connecting electrodes 8 are electrically connected together through the inter-substrate connecting bumps 4 and the mutually layered semiconductor devices of a layered semiconductor device 10 are electrically and mechanically connected together. A method for connecting the semiconductors 1 respectively forming layers is not limited to a soldering method, and various kinds of connecting methods such as connections using ACF, conductive paste or Au bumps may be employed.

When the inter-substrate connecting bumps 4 are solder bumps, flux is applied to the cut flat surfaces 4a thereof and the lower inter-substrate connecting electrodes 8 of the semiconductor devices 1 of upper layers are superposed thereon, so that a plurality of semiconductor devices 1 can be layered only by reflow soldering. Since the encapsulating resin 5 surrounds the peripheries of the cut flat surfaces 4a of the exposed solder bumps 4, the encapsulating resin 5 performs a function the same as that of a solder resist. Accordingly, narrow pitches to be extremely hardly mounted can be mounted. For instance, when the remaining maximum thickness of the semiconductor chip 3 after it is ground is 0.1 mm, the semiconductor chip 3 can meet the solder bumps 4 with space therebetween of 0.5 mm or more, and accordingly, a high density mounting can be achieved.

In the layered semiconductor device 10 shown in FIG. 6, when a flash memory chip of, for instance, 64 megabytes is employed for the semiconductor chip 3, a memory module of 256 megabytes in which four flash memories are contained within the thickness of 0.7 mm can be formed. The layered semiconductor device 10 constituted as the memory module can be mounted on a circuit board of an electronic device by a method such as a soldering method to be used as a built-in memory, or accommodated in a prescribed casing to be formed as a removable memory device.

In the layered semiconductor device 10 shown in FIG. 6, the four semiconductor devices 1 each of which has the semiconductor chip 3 mounted on only one or the other surface are layered, however, the number of the layered semiconductors is not limited four, and four or smaller or four or larger number may be suitably selected as required.

On the substrate 2 of each semiconductor device 1 which is layered to form the layered semiconductor device 10, the inter-substrate connecting electrodes 7 and 8 having the same number are respectively formed on the same positions to share the substrate 2. When an identification symbol ID is required to identify each semiconductor device 1 to be layered, the connecting relation between the respective semiconductor devices 1 is specified by controlling to which inter-substrate connecting electrodes 7 of the substrate 2, the inter-substrate connecting bumps 4 are applied and to which inter-substrate connecting electrodes 7, the inter-substrate connecting bumps 4 are not applied, so that the identification symbol ID peculiar to each semiconductor device 1 can be given thereto. In this case, the inter-substrate connecting electrodes 7 in which the inter-substrate connecting bumps 4 are not provided are covered with the encapsulating resin 5. Since this encapsulating resin 5 serves as the resist, an erroneous connection due to swelling out solder is prevented. Therefore, after the flux is applied to the exposed solder bumps 4, the prescribed number of semiconductor devices 1 are layered, and then, the preferable electrical and mechanical connection between the respective semiconductor devices 1 is realized by reflow soldering.

Figure 7:
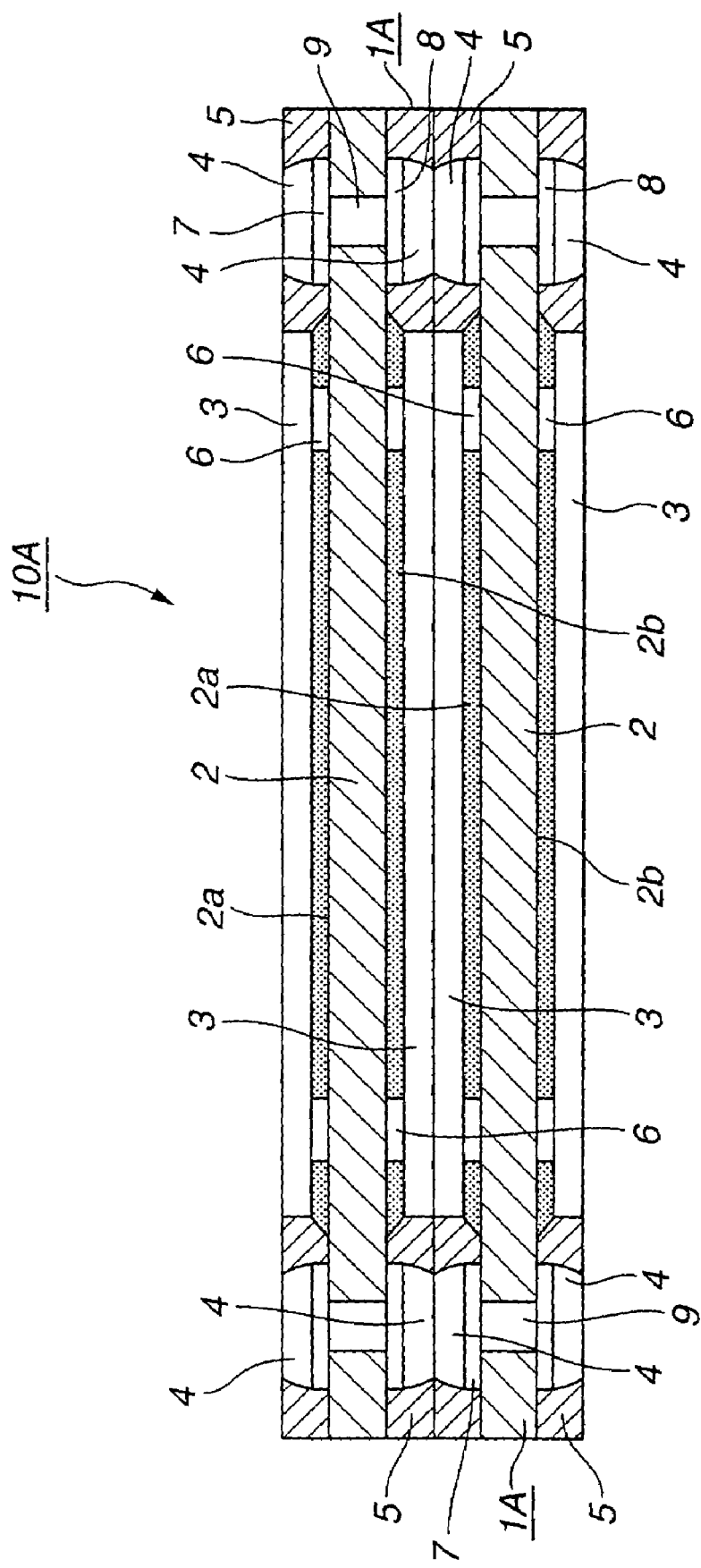
FIG. 7 is a schematic sectional view showing a second embodiment of the layered semiconductor device according to the present invention.

Now, a second embodiment of a layered semiconductor device according to the present invention is shown in FIG. 7. In the layered semiconductor device 10A shown in FIG. 7, are layered two both-surface type semiconductor devices each of which has a semiconductor chip 3 and inter-substrate connecting bumps 4 mounted on the other surface side 2b of a substrate 2 as well as one surface side 2a of the substrate 2.

In the layered semiconductor device 10A shown in FIG. 7, inter-substrate connecting bumps 4 provided on upper inter-substrate connecting electrodes 7 of the semiconductor device 1A located in a lower layer side are connected to inter-substrate connecting bumps 4 provided on lower inter-substrate connecting electrodes 8 of the semiconductor device 1A located in an upper layer side.

In the layered semiconductor device 10A, when a flash memory chip of, for instance, 64 megabytes is used as the semiconductor chip 3 provided in each semiconductor device 1A, a memory module of 256 megabytes in which four flash memory chips are contained within the thickness of 0.5 mm can be formed. Further, when four semiconductor devices 1A are layered, a memory module of 512 megabytes in which eight flash memory chips are contained within the thickness of 1 mm can be formed.

The layered semiconductor device 10A constituted as the memory module shown in FIG. 7 may be mounted on a circuit board of an electronic device by a method such as a soldering method like the above-described layered semiconductor device 10 to be used as a built-in memory, or may be accommodated in a prescribed casing to be constituted as a removable memory device.

Now, a method for manufacturing the semiconductor device 1 shown in FIG. 4 will be described below.

Figure 8:
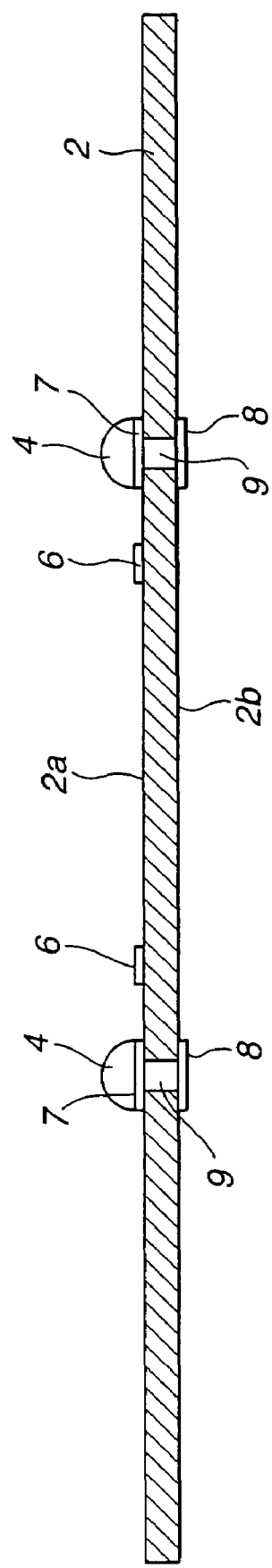
FIGS. 8 to 12 are sectional views showing a first embodiment of a method for manufacturing a semiconductor device according to the present invention.

A substrate 2 forming the semiconductor device 1 is an interposed substrate with the entire thickness of about 100 m including a core material with the thickness of, for instance, about 50 m having a single side pattern of about 25 m on one surface side. In a semiconductor chip mounting area, electrodes 6 for a chip for connecting electrodes not shown in the drawing of a semiconductor chip 3, for instance, a silicon chip to a wiring pattern not shown in the drawing are provided. Electrodes 7 and 8 for connecting the electrodes 6 for the chip to external parts are provided outside the semiconductor electrode mounting area. Since the electrodes 7 and 8 for connecting the electrodes 6 for the chip to the external parts are mainly used for connecting inter-spaces of the substrate 2, they are explained by using the name of "inter-substrate connecting electrodes" in the following description. The inter-substrate connecting electrodes 7 and 8 provided on one and the other surfaces of the substrate 2, that is, on both the front and back surfaces are electrically connected by through holes 9 bored in the substrate 2 as shown in FIG. 8. The substrate 2 shown in FIG. 8 shows an area corresponding to one semiconductor device 1 and peripheral parts thereof. However, actually, many areas are formed integrally and they are divided into individual semiconductor devices 1 after all processes are completed. As shown in FIG. 4, in the substrate 2 having the semiconductor chip 3 mounted on only one surface, the pattern and electrodes for the chip are formed on only one surface 2a and only the inter-substrate connecting electrodes 8 are formed on the other surface 2b.

In order to manufacture the semiconductor device 1 shown in FIG. 4, the inter-substrate connecting bumps 4 are firstly formed on the inter-substrate connecting electrodes 7 on a surface of the substrate 2 on which the semiconductor chip 3 is mounted, as shown in FIG. 8. For instance, when the inter-substrate connecting bumps 4 are solder bumps, solder is applied to the inter-substrate connecting electrodes 7 to form the bumps by a reflow soldering method. The inter-substrate connecting bumps 4 are formed to be higher than a finally required height.

Figure 9:
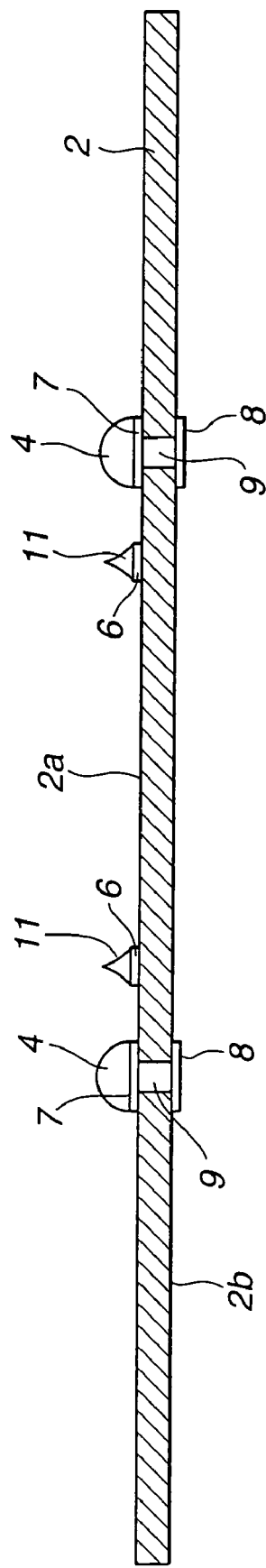

Then, as shown in FIG. 9, stud bumps 11 are formed on the electrodes 6 for the chip provided on one surface side 2a of the substrate 2. The stud bumps 11 are, for example, Au stud bumps, and formed by employing a stud bump bonding device or a wire bonding device.

Figure 10:
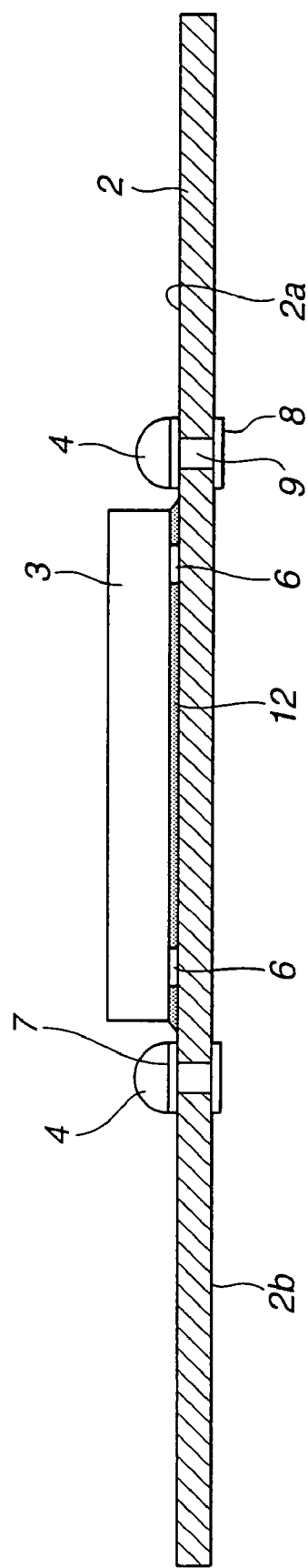

Then, as shown in FIG. 10, the semiconductor chip 3 is mounted on the one surface side 2a of the substrate 2. That is, the semiconductor chip 3, for instance, the silicon chip is mounted on the semiconductor chip mounting area while its face directed downward, electrodes on the semiconductor chip 3 not shown in the drawing are connected to the stud bumps 11, a reinforcing resin 12 is supplied to a part between the semiconductor chip 3 and the substrate 2 and cured. The thickness of the semiconductor chip 3 may be larger than a finally required thickness. For instance, even when it is desired to finally obtain the thickness of the semiconductor chip 3 of 50 m, the semiconductor chip having the thickness of 200 m or larger can be used.

The electrodes on the semiconductor chip 3 are connected to the stud bumps 11 by using, for instance, a ultrasonic bonding device and applying a ultrasonic wave from the back side of the semiconductor chip mounting surface 2a of the substrate 2. The electrodes of the semiconductor chip 3 may be connected to the electrodes 6 for the chip by other flip chip connecting methods except the ultrasonic bonding method such as ACF, C4, ACP, etc.

When the connection of the electrodes of the semiconductor chip 3 to the electrodes 6 for the chip is completed, the reinforcing resin 12 is supplied to an interface between the semiconductor chip 3 and the substrate 2 and cured. As the reinforcing resin 12, a suitable resin such as a thermosetting resin or a UV curing resin may be employed. Before the electrodes of the semiconductor chip 3 are connected to the electrodes 6 for the chip, the reinforcing resin 12 may be previously applied to the interface to spread and cure the reinforcing resin 12 in the interface simultaneously with the ultrasonic bonding.

Figure 11:
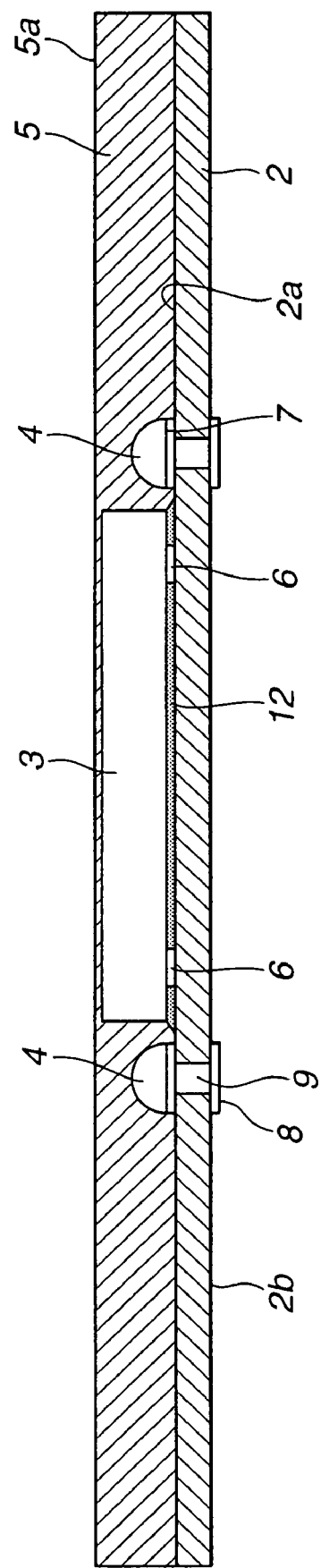

After that, as shown in FIG. 11, an encapsulating resin 5 is supplied to the substrate 2 so as to bury the semiconductor chip 3 and the inter-substrate connecting bumps 4 to cure the encapsulating resin 5. At this time, the lower surface of the substrate 2, that is, a surface 2b opposite to the surface 2a on which the semiconductor chip 3 is mounted is parallel to the upper surface 5a of the encapsulating resin 5. Therefore, is desirably used a device such as a transfer mold device in which the other surface 2b of the substrate 2 and the upper surface 5a of the encapsulating resin 5 are fixed by a mold.

Figure 12:
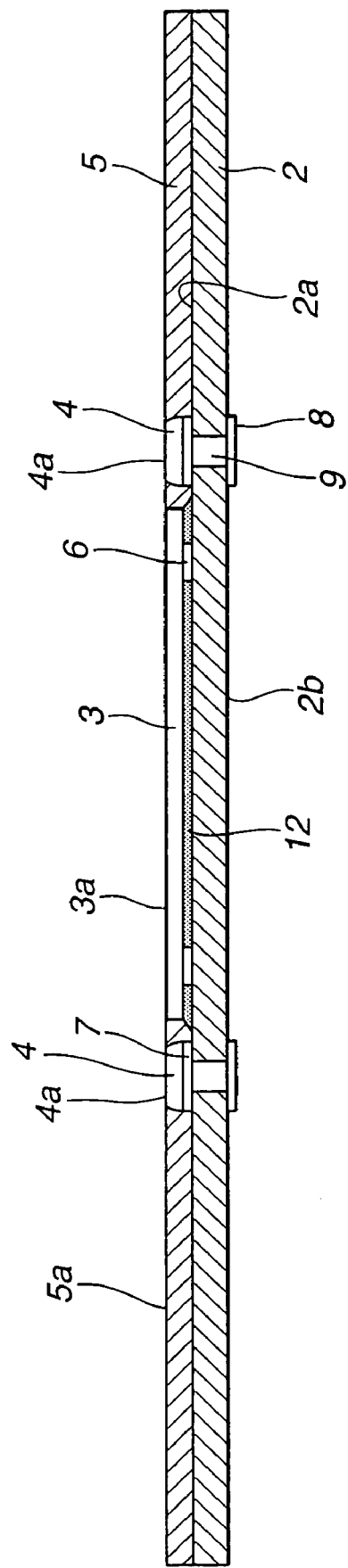

Then, the semiconductor chip 3 and the inter-substrate connecting bumps 4 and the encapsulating resin 5 are fixed by a surface grinder by using the exposed surface of the substrate 2, that is, the other surface 2b as a reference to grind the upper surface 5a of the encapsulating resin 5 located at the opposite side to the reference surface. Thus, since the semiconductor chip 3 and the inter-substrate connecting bumps 4 are exposed, the semiconductor chip 3 and the inter-substrate connecting bumps 4 are further ground together with the encapsulating resin 5 until a desired thickness, for instance, the height from the mounting surface 2a of the substrate 2 to the semiconductor chip 3 reaches 50 m (see FIG. 12).

Then, each part having one semiconductor chip 3 is separated from other parts to form individual pieces. Thus, the semiconductor device 1 as shown in FIG. 4 is formed in which one semiconductor chip 3 is provided in the thickness of 150 m.

Now, a method for manufacturing the layered semiconductor device 10A shown in FIG. 7 will be described below.

Figure 13:
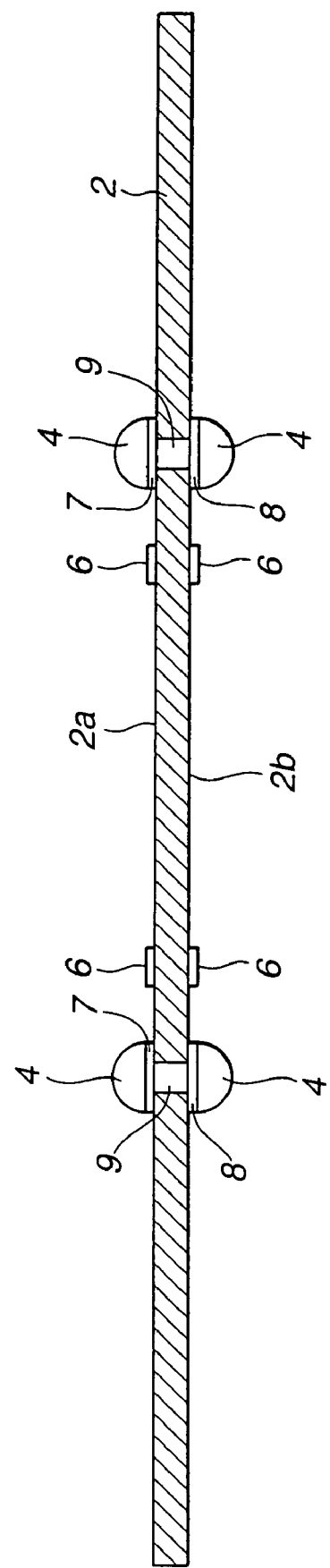
FIGS. 13 to 20 are sectional views showing a second embodiment of a method for manufacturing a semiconductor device according to the present invention.

In the layered semiconductor device 10A shown in FIG. 7, is used a substrate 2 having patterns and electrodes 6 for chips provided on both surfaces. In the layered semiconductor device 10A, as shown in FIG. 13, inter-substrate connecting bumps 4 and 4 are formed on inter-substrate connecting electrodes 7 and 8 respectively provided on both the surfaces of the substrate 2 on which the semiconductor chips 3 are mounted. These solder bumps 4 and 4 are formed, for instance, by applying solder to the inter-substrate connecting electrodes 7 and 8 and then performing a reflow soldering method. The inter-substrate connecting bumps 4 are formed so as to be higher than a finally required height.

Figure 14:
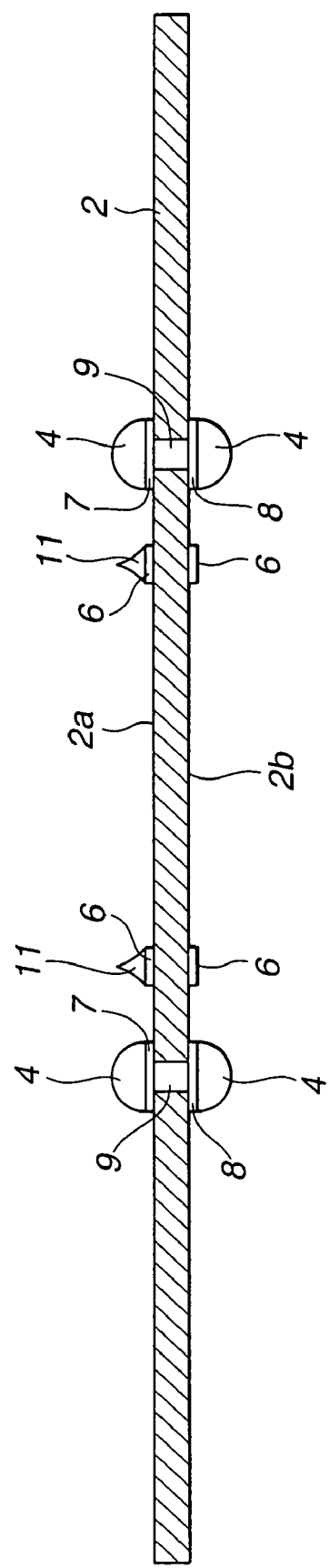

Subsequently, as shown in FIG. 14, stud bumps 11 are formed on the electrodes 6 for the chip provided in one surface side 2a of the substrate 2. The stud bumps 11 are, for instance, Au stud bumps and formed by employing a stud bump bonding device or a wire bonding device.

Figure 15:
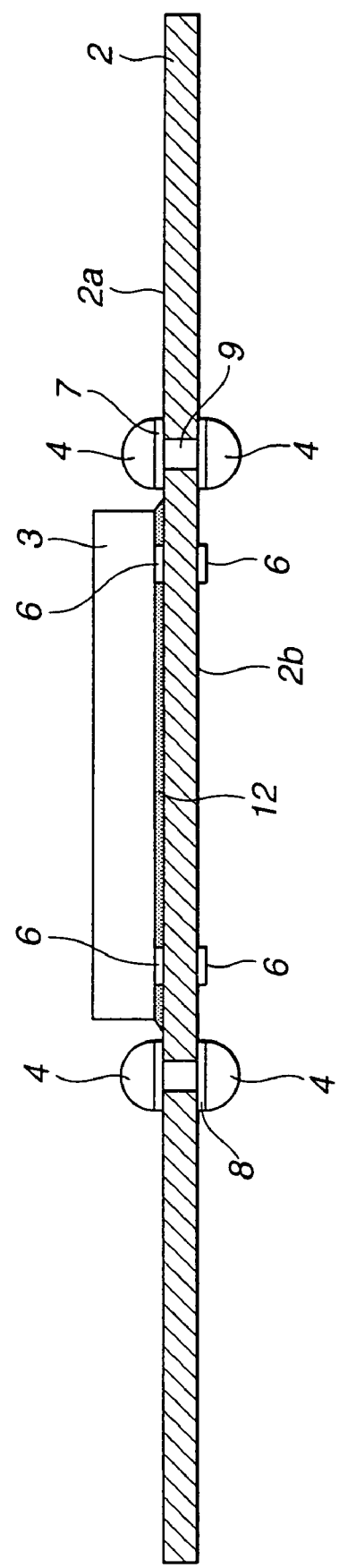
Figure 16:
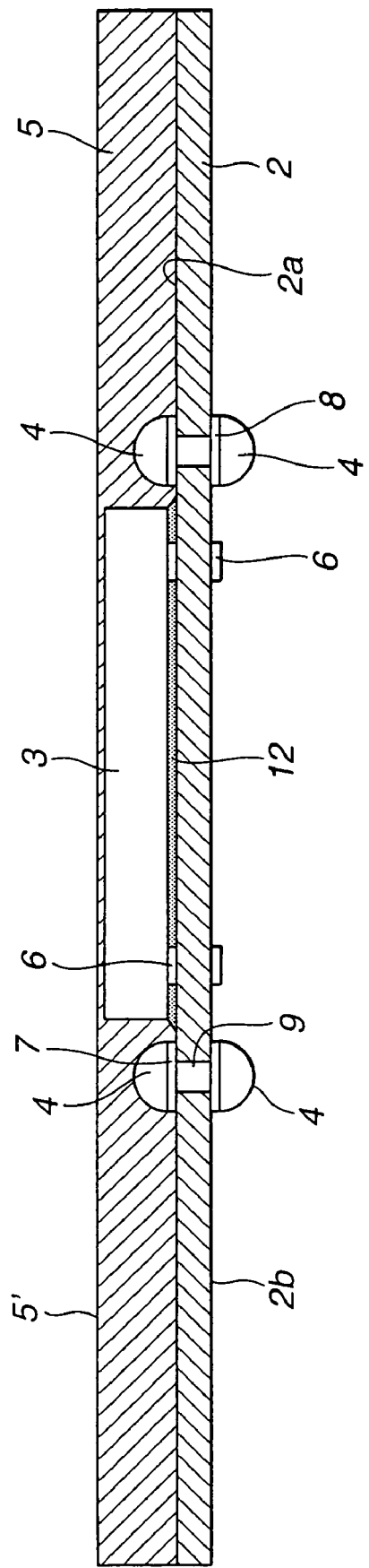

Then, the stud bumps 11 are connected to the electrodes of the semiconductor chip 3. As shown in FIG. 15, a reinforcing resin 12 is allowed to enter an interface between the substrate 2 and the semiconductor chip 3 and cured to mount the semiconductor chip 3. After that, as shown in FIG. 16, the semiconductor chip 3 and the inter-substrate connecting bumps 4 on the one surface 2a of the substrate 2 are encapsulated by an encapsulating resin 5.

Figure 17:
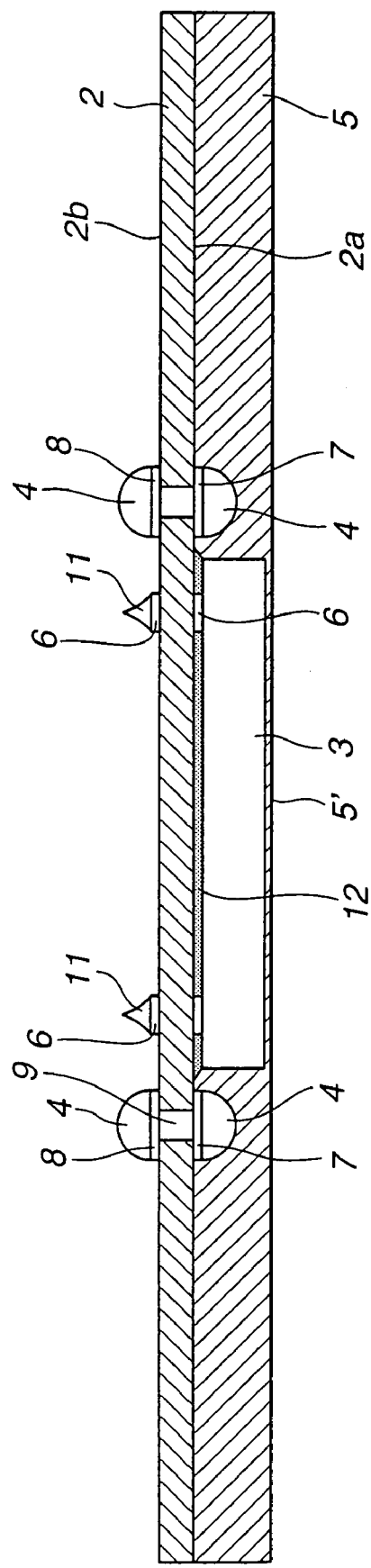
Figure 18:
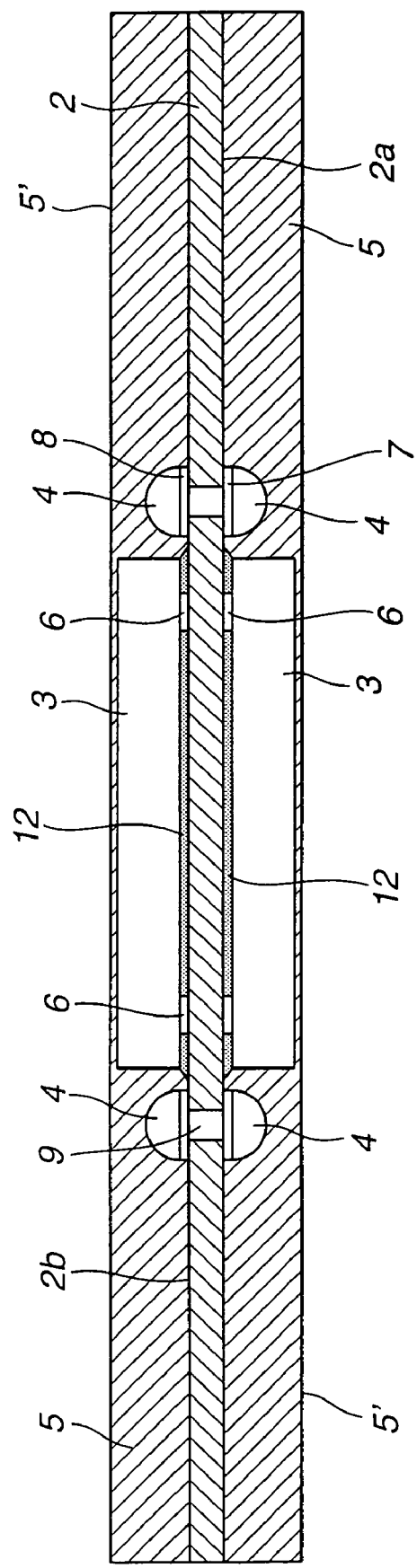

Then, as shown in FIG. 17, stud bumps 11 are likewise formed on electrodes 6 for a chip on the other surface 2b of the substrate 2 and a mounting step of the semiconductor chip 3 and an encapsulating step by the encapsulating resin 5 are carried out as shown in FIG. 18 after the same steps are performed on the one surface 2a.

Figure 19:
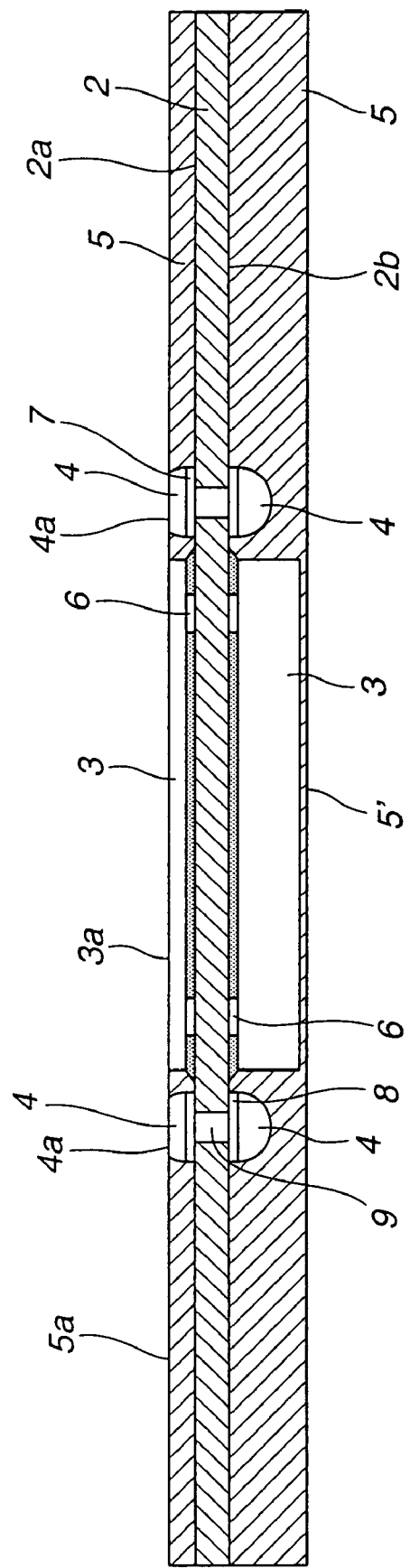
Figure 20:
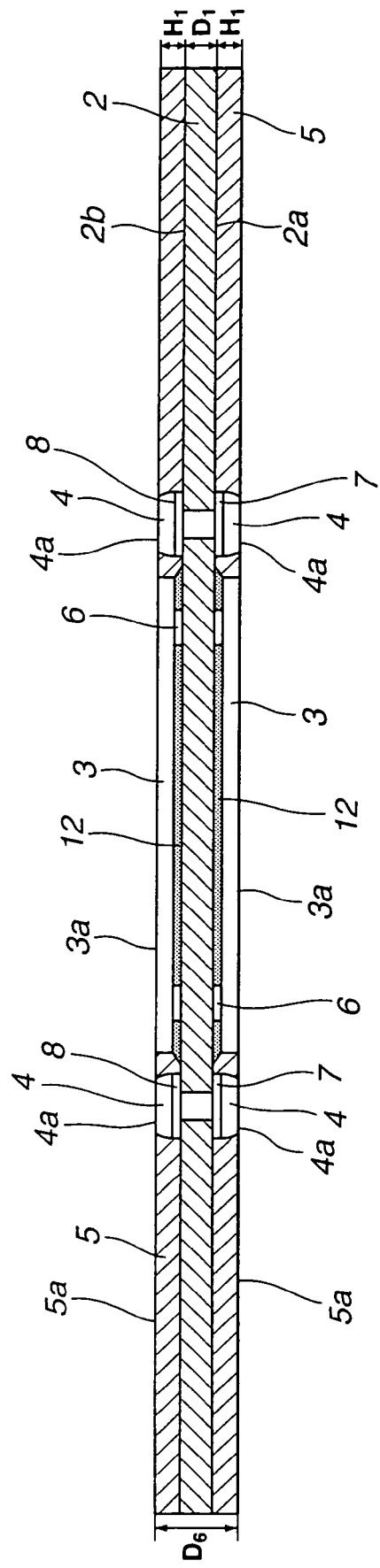

Subsequently, as shown in FIG. 19, a grinding operation is carried out on the one surface 2a of the substrate 2, and then, the grinding operation is also carried out on the other surface 2b of the substrate 2 as shown in FIG. 20. For instance, when one and the other surfaces 2a and 2b of the substrate 2 are respectively ground until a desired thickness, for instance, the height $H_1$ of the semiconductor chip 3 from each of surfaces 2a and 2b of the substrate 2 on which the semiconductor chip 3 is mounted reaches 50 m, two semiconductor chips 3 and 3 can be accommodated within a range of an entire thickness $D_6$ of 200 m by using the substrate 2 whose thickness $D_1$ ranges from 100 m to 150 m.

A part in which each semiconductor chip 3 is provided in each of surfaces 2a and 2b of the substrate 2 is separated from other parts to form individual parts. Thus, is formed the semiconductor device 1A as shown in FIG. 5 in which two semiconductor chips 3 are provided within a range of the thickness $D_6$ of 200 m.

In the semiconductor device 1 and the semiconductor device 1A according to the present invention, after the semiconductor chip 3 mounted on the substrate 2 with its face directed downward is encapsulated by the encapsulating resin 5, the semiconductor chip 3 is cut together with the encapsulating resin 5. Accordingly, load applied upon cutting is distributed to the encapsulating resin 5 so that the load exerted on the semiconductor chip 3 becomes extremely small, the damage of the semiconductor chip 3 such as cracks upon cutting can be assuredly prevented, the semiconductor chip 3 can be cut to be thinner and the mounting density of the semiconductor chip 3 can be improved within a prescribed thickness.

Since the inter-substrate connecting bumps 4 are formed on the inter-substrate connecting electrodes 7 and/or 8 for electrically connecting an inter-space of the substrate 2 or the substrate 2 to external connecting parts before the semiconductor chip 3 is mounted on the substrate 2, even when a connecting material flows out to the inter-substrate connecting electrodes to come into contact with the inter-substrate connecting bumps 4 or bury the inter-substrate connecting bumps 4 in accordance with the flip chip bonding upon mounting the semiconductor chip 3, the connecting material is removed by a subsequent cutting step. Therefore, the space between the mounting area of the semiconductor chip 3 and the inter-substrate connecting bumps 4 and the space between the inter-substrate connecting bumps 4 can be decreased. Consequently, the planar forms of the semiconductor device 1 and the semiconductor device 1A can be made compact.

Now, a third embodiment of a semiconductor device according to the present invention will be described by referring to FIGS. 21 and 22.

Figure 21:
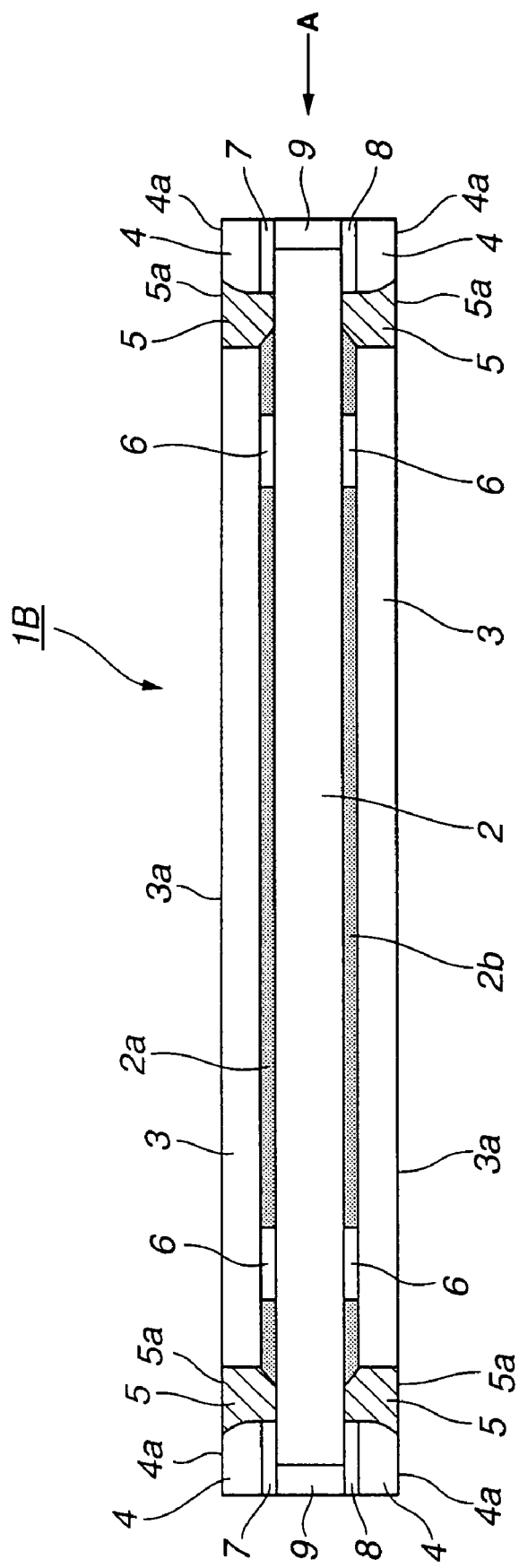
FIG. 21 is a sectional view showing a third embodiment of a semiconductor device according to the present invention and FIG. 22 is a side view of the above-described semiconductor device.
Figure 22:
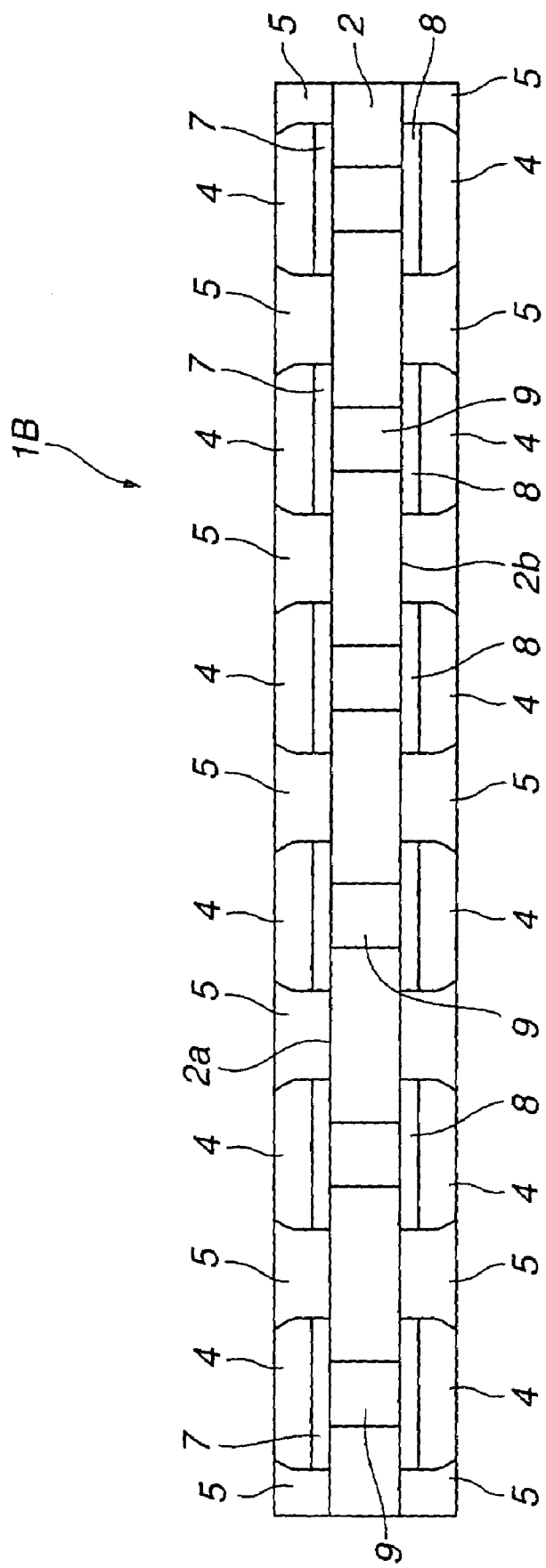

In the semiconductor device 1B according to the third embodiment shown in FIGS. 21 and 22, through holes 9 and inter-substrate connecting bumps 4 provided in the semiconductor device 1A according to the second embodiment are exposed to the side surfaces of the substrate 2. That is, the through holes 9 and the inter-substrate connecting bumps 4 are formed so as to be visually seen from the side parts of the semiconductor device 1B in the direction of an arrow mark A in FIG. 21. When a part having one semiconductor chip 3 on each of both surfaces of the substrate 2 is formed as an individual piece in the steps of manufacturing the semiconductor device 1A shown in FIG. 5, the individual piece is formed by cutting parts where the through holes 9 and the inter-substrate connecting bumps 4 are located.

When the individual piece is formed, parts outside the parts where the through holes 9 and the inter-substrate connecting bumps 4 are located may be cut, and then, the parts where the though holes 9 and the inter-substrate connecting bumps 4 are located may be cut. These through holes 9 and the inter-substrate connecting bumps 4 may be exposed to the side surfaces.

Now, referring to FIGS. 23 and 24, a third embodiment of a layered semiconductor device according to the present invention will be described below.

Figure 23:
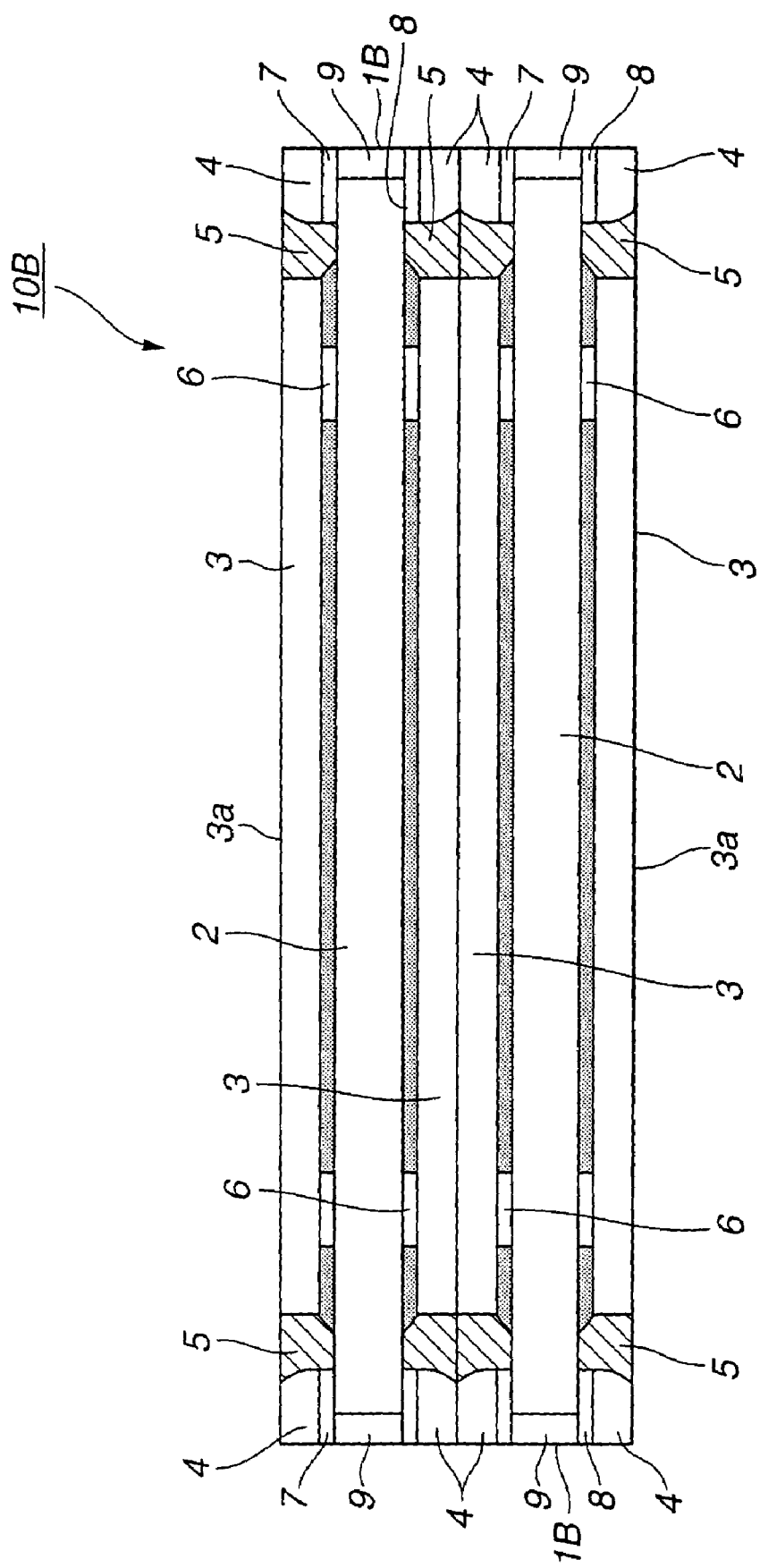
FIG. 23 is a sectional view showing a third embodiment of a layered semiconductor device and FIG. 24 is a substantial side view of the above-described layered semiconductor device.
Figure 24:
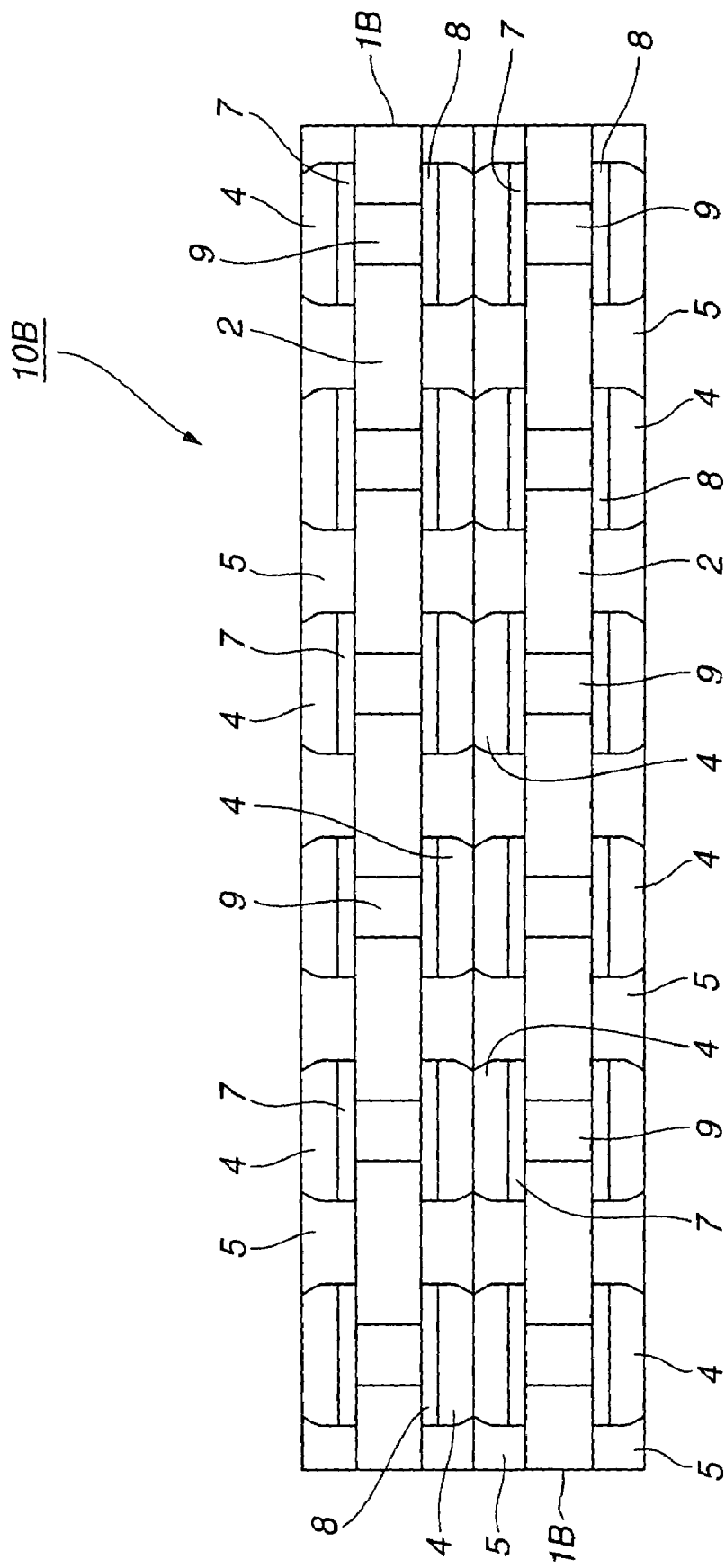

The layered semiconductor device 10B shown in FIGS. 23 and 24 is formed by layering a plurality of semiconductor devices 1B shown in FIGS. 21 and 22 in which the through holes 9 and the inter-substrate connecting bumps 4 are exposed to the side surface of the substrate 2.

As described above, when the layered semiconductor device 10B is manufactured by layering a plurality of semiconductor devices 1B each having the through holes 9 and the inter-substrate connecting bumps 4 exposed to the side surfaces of the substrate 2, the connected states of the inter-substrate connecting bumps 4 of the semiconductor devices 1B respectively layered vertically can be visually recognized from the side parts and the imperfect connections between the semiconductor devices 1B can be assuredly decreased. Further, when the inter-substrate connecting bumps 4 are connected together by heating, for instance, where the inter-substrate connecting bumps 4 are formed by solder, the connecting material such as flux or the inter-substrate connecting bumps 4 cannot be directly heated in the semiconductor device 1 according to the first embodiment and the semiconductor device 1A according to the second embodiment. However, since the inter-substrate connecting bumps 4 are exposed to the side surfaces of the substrate 2 in the layered semiconductor device 10B according to the third embodiment, the connecting material or the inter-substrate connecting bumps 4 can be directly heated from the side surfaces by using, for instance, a soldering iron, etc. to connect the inter-substrate connecting bumps 4 together.

Now, a fourth embodiment of a semiconductor device will be described by referring to FIG. 25.

Figure 25:
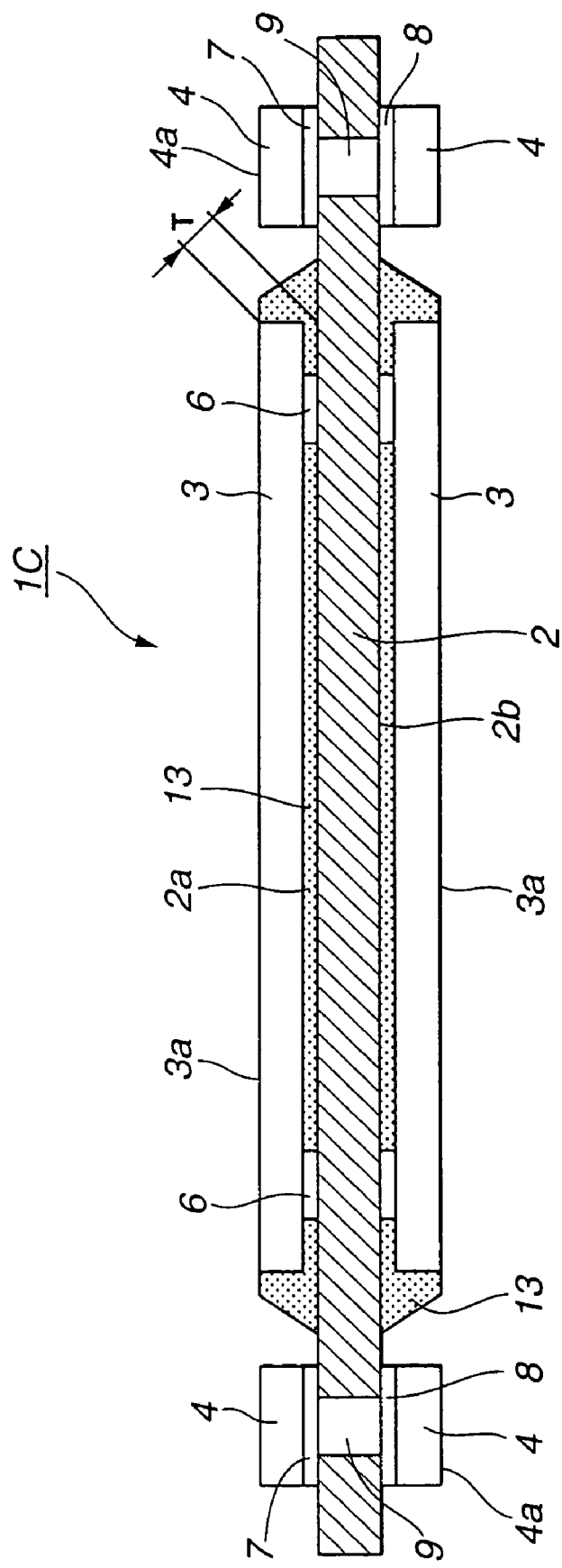
FIG. 25 is a sectional view showing a fourth embodiment of a semiconductor device according to the present invention.

A semiconductor device 1C shown in FIG. 25 has semiconductor chips 3 and 3 respectively mounted on both surfaces of one surface 2a and the other surface 2b of a substrate 2. Surfaces 3a and 3a opposite to the surfaces of the semiconductor chips 3 and 3 opposed to the substrate 2 are cut to be thin. The semiconductor chips 3 and 3 are connected to the substrate 2 by polymer materials 13 and 13. The polymer materials 13 and 13 adhere round to the four side surfaces of the semiconductor chips 3 and 3. In FIG. 25, the polymer materials 13 adhere to the two opposed surfaces of the semiconductor chips 3.

Further, inter-substrate connecting bumps 4 are respectively provided on inter-substrate connecting electrodes 7 provided on one surface 2a of the substrate 2 and inter-substrate connecting electrodes 8 provided on the other surface 2b of the substrate 2. After these inter-substrate connecting bumps 4 are respectively formed on the inter-substrate connecting electrodes 7 and 8, they are made to collapse so as to have prescribed thickness. Further, the inter-substrate connecting bumps 4 are formed so that they have flat surfaces 4a cut so as to be located in the same plane as that of the cut flat surfaces 3a of the semiconductor chips 3.

In the semiconductor device 1C formed as shown in FIG. 25, since the semiconductor chips 3 and 3 respectively provided on both the surfaces 2a and 2b of the substrate 2 are fixed to the substrate 2 by the polymer materials 13 and 13 rounding the side surfaces thereof, load exerted on the semiconductor chips 3 is distributed when the semiconductor chips 3 are ground to desired thickness to suppress the load applied to the semiconductor chips 3 and 3 upon grinding and more decrease the thickness while the semiconductor chips 3 and 3 are assuredly protected.

The semiconductor device 1C shown in FIG. 25 is different from the semiconductor device 1, the semiconductor device 1A and the semiconductor device 1B. In the semiconductor device 1C, since only the periphery of the semiconductor chip 3 is covered with the encapsulating resin and the entire part of the semiconductor chip 3 is not buried in the encapsulating resin, the encapsulating resin does not need to be ground when the semiconductor chip is ground to a prescribed thickness, so that a grinding operation can be efficiently carried out and the exhaustion of a grinder can be reduced.

In the semiconductor device 1C shown in FIG. 25, in order to fix the semiconductor chip 3 to the substrate 2 and connect the electrodes of the semiconductor chip 3 to electrodes 6 for the chip on the substrate 2, for example, an anisotropic conductive material can be employed. Since the anisotropic conductive material is employed to thermocompression-bond the anisotropic conductive material provided between the semiconductor chip 3 and the substrate 2, the semiconductor chip 3 can be fixed to the substrate 2 and the electrodes of the semiconductor chip 3 can be conducted to the electrodes 6 for the chip on the substrate 2 at the same time. Thus, a workability is improved. The anisotropic conductive material may be provided in the form of an ACP (anisotropic conductive paste). When the anisotropic conductive material is supplied in the form of an ACF (anisotropic conductive film), it is easily handled so that the workability of a method for manufacturing the semiconductor device 1C can be improved. The semiconductor chip 3 is positioned on the substrate 2 and stuck thereto by using the ACF and the semiconductor chip 3 is thermocompression-bonded under this state to electrically connect the electrodes of the semiconductor chip 3 to the electrodes 6 for the chip on the substrate 2 and fix the semiconductor chip 3 to the substrate 2 by the polymer material 13 as a binder of the ACF. As the polymer material 13 for fixing the semiconductor chip 3 to the substrate 2, the anisotropic conductive material does not need to be necessarily used.

Further, in the semiconductor device 1C shown in FIG. 25, after the inter-substrate connecting bumps 4 are provided on the substrate 2, the inter-substrate connecting bumps 4 are made to collapse to positions near the height obtained by grinding, and then, ground to a prescribed height. Since the inter-substrate connecting bumps 4 formed on the substrate 2 come into firmly and tightly contact with the substrate 2 and the inter-substrate connecting electrodes 7 and 8 formed on the substrate 2 by the collapsing step, the inter-substrate connecting bumps 4 can be certainly prevented from slipping off from the substrate 2 due to a grinding operating and the reliability of the obtained semiconductor device 1C is improved.

Although, in the semiconductor device 1C shown in FIG. 25, the semiconductor chips 3 are respectively mounted on the surfaces 2a and 2b of the substrate 2, it is understood that the present invention may be applied to a semiconductor device in which the semiconductor chip 3 is mounted on only one surface 2a or a surface 2b of the substrate 2.

Now, a method for manufacturing the semiconductor device 1C according to the fourth embodiment will be described below by referring to FIGS. 26 to 31.

Figure 26:
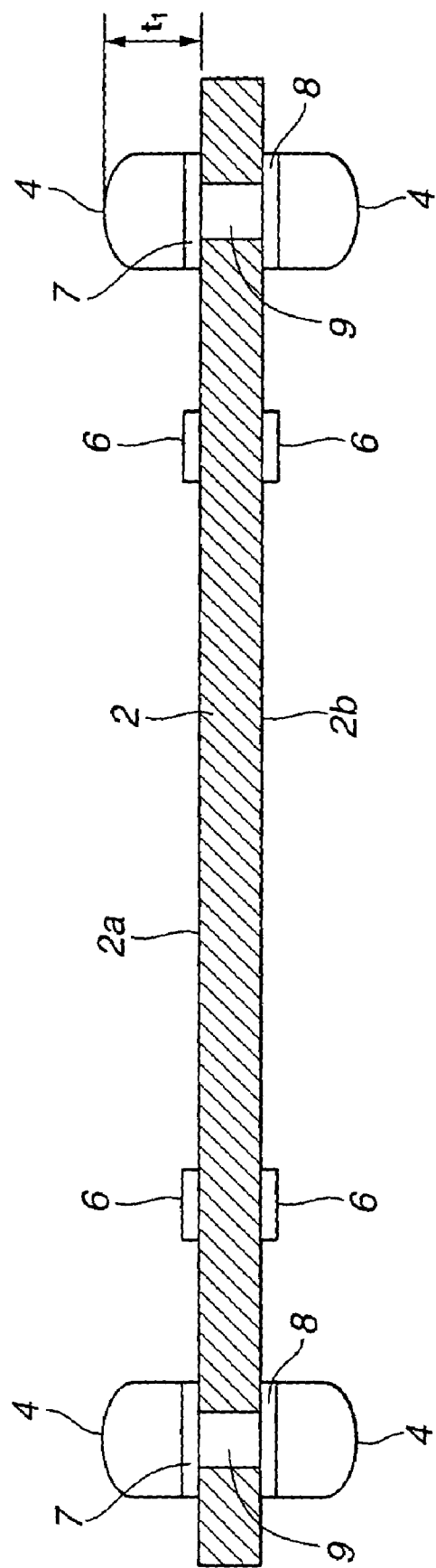
FIGS. 26 to 31 are sectional views showing in order of steps a method for manufacturing the semiconductor device according to the fourth embodiment of the present invention.

In order to manufacture the semiconductor device 1C, as shown in FIG. 26, is prepared a substrate 2 having electrodes 6 and 6 for chips and inter-substrate connecting electrodes 7 and 8 respectively formed on one surface 2a and the other surface 2b. In the substrate 2, are formed conductor patterns not shown in the drawing by which the electrodes 6 and 6 for the chips and the inter-substrate connecting electrodes 7 and 8 respectively formed on one surface 2a and the other surface 2b are electrically connected together. Further, through holes 9 are formed to electrically connect the inter-substrate connecting electrodes 7 and 8 respectively formed on the one surface 2a and the other surface 2b. As shown in FIG. 26, inter-substrate connecting bumps 4 are formed on the inter-substrate connecting electrodes 7 and 8 respectively formed on the surfaces 2a and 2b of the substrate 2. The inter-substrate connecting bumps 4 are formed in such a manner that the height $t_1$ of the bumps is slightly larger than the height T of the semiconductor chip 3 after a grinding operation (see FIG. 25).

When the inter-substrate connecting bumps 4 formed on the inter-substrate connecting electrodes 7 and 8 are solder bumps, solder is initially applied to the one surface 2a of the substrate 2 by, for instance, a screen printing method and a reflow soldering process is performed. Then, solder is likewise applied to the other surface 2b of the substrate 2 by the screen printing method and the reflow soldering process is performed to form the solder bumps. In such a manner, the dome shaped solder bumps 4 are respectively formed on both the surfaces of one surface 2a and the other surface 2b of the substrate 2.

Figure 27:
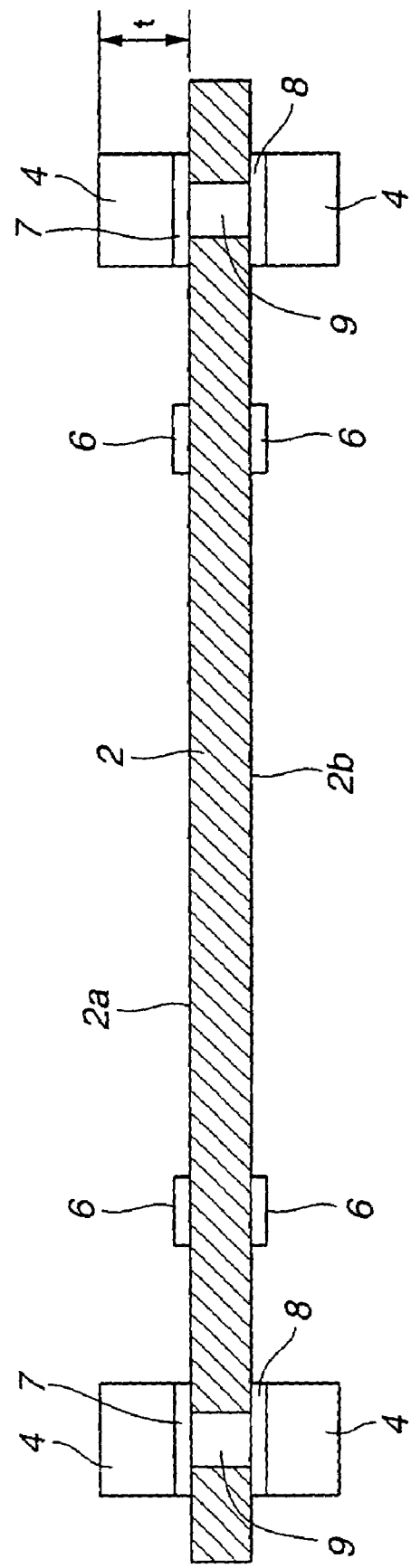

The inter-substrate connecting bumps 4 respectively formed on the surfaces 2a and 2b of the substrate 2 are made to collapse at the same time by a press molding so as to have a presecribed height t as shown in FIG. 27. The prescribed height t is a slightly larger than the height of the semiconductor chip 3 after the semiconductor chip 3 is ground. When the inter-substrate connecting bumps 4 are formed by the solder bumps, an unevenness in the amount of supply of solder cannot be avoided even in the screen printing method by which the solder is relatively uniformly supplied. The unevenness of the supply of solder appears as an unevenness in height of supplied solder, however, the collapsing step is carried out so that the heights t of the inter-substrate connecting bumps 4 are accurately made uniform. The accuracy of height of the inter-substrate connecting bumps 4 before the grinding operation is improved as described above, and accordingly, pressure applied in the direction of the thickness of the substrate 2 upon grinding can be equally received by the inter-substrate connecting bumps 4 respectively located at opposite sides and the deflection of the substrate 2 upon grinding can be prevented.

Figure 28:
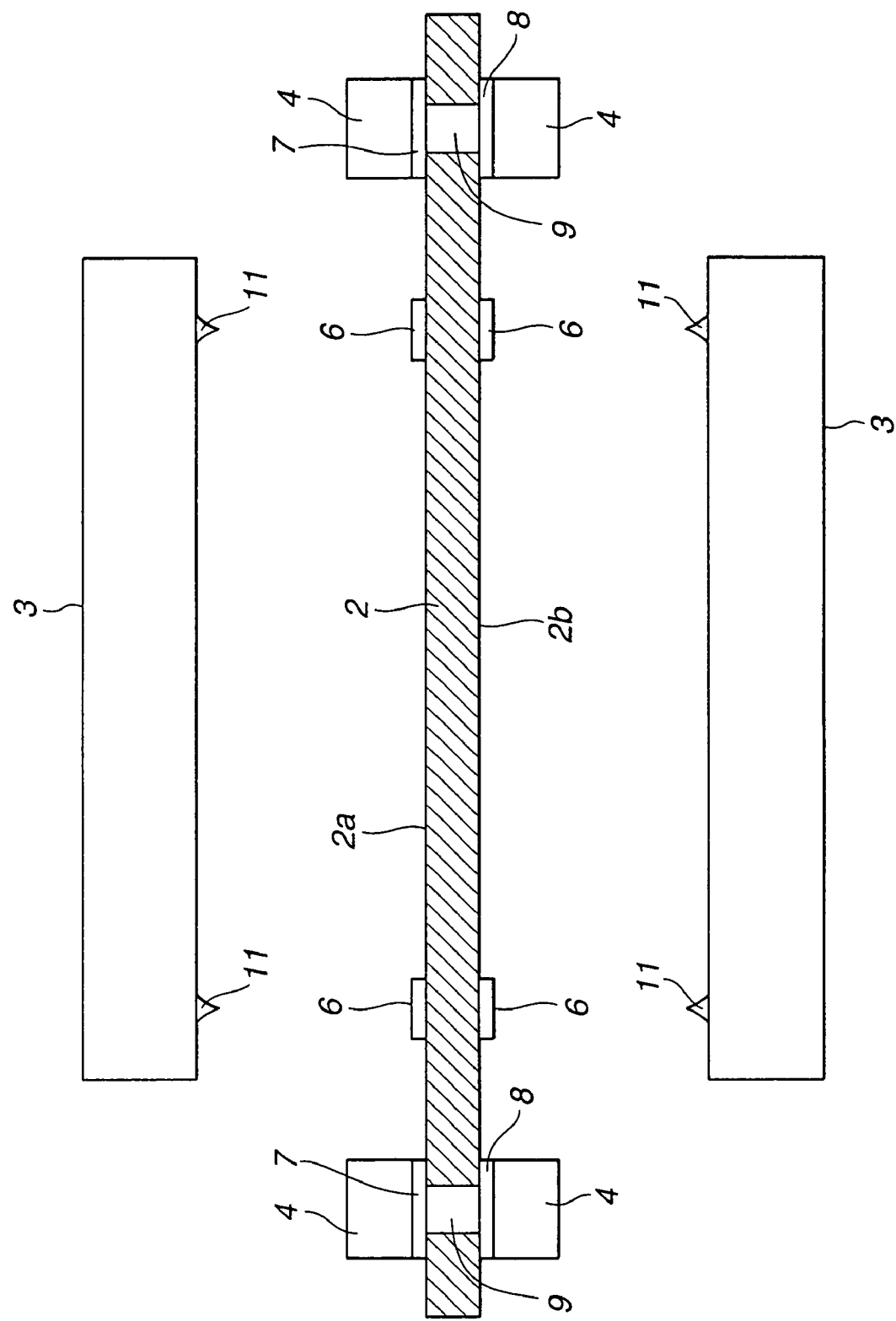

As shown in FIG. 28, on the electrodes of the semiconductor chips 3 not shown in the drawing, stud bumps 11 are formed. The stud bumps 11 are, for instance, Au stud bumps and formed by using a stud bonding device or a wire bonding device.

Figure 29:
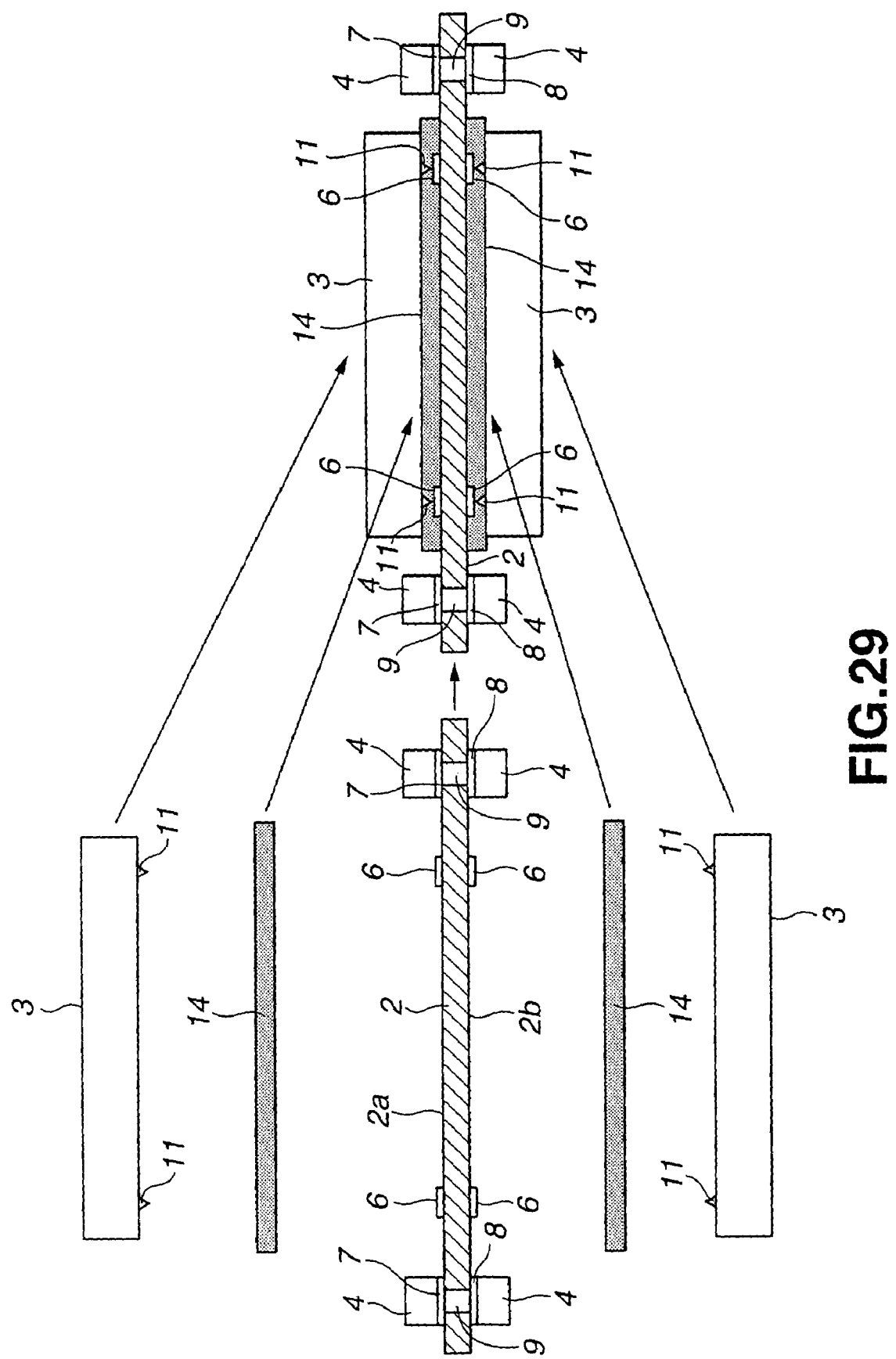

Then, as shown in FIG. 29, the semiconductor chips 3 having the stud bumps 11 formed are mounted on one and the other surfaces 2a and 2b of the substrate 2 while they are positioned thereon. That is, the semiconductor chips 3 are arranged respectively on the surfaces 2a and 2b of the substrate 2 in such a manner that the surfaces having the stud bumps 11 formed are opposed to the surfaces 2a and 2b of the substrate 2 to locate the stud bumps 11 on the electrodes 6 for the chips.

The semiconductor chips 3 disposed on the substrate 2 are respectively stuck to the surfaces 2a and 2b of the substrate 2 by, for instance, ACFs (anisotropic conductive films) 14. The ACF is formed by dispersing conductive particles in an adhesive (binder) composed of a polymer material to have a film type material and coating a separator therewith. The ACFs are interposed between the semiconductor chips 3 and the substrate 2 by peeling off the separators not shown in the drawing to stick the semiconductor chips 3 to the substrate 2. When the semiconductor chips 3 and 3 are connected to the substrate 2 through anisotropic conductive materials, a paste type anisotropic conductive material (ACP) may be also employed. When the anisotropic conductive material is supplied in the form of ACP, an exclusive dispenser is required so that the device becomes large and it is troublesome to handle it. However, since the above-described ACF is used, the device can be easily handled and the large device is not required.

The substrate 2 having the semiconductor chips 3 stuck to the respective surfaces 2a and 2b through the ACFs is thermocompression-bonded. That is, the semiconductor chips 3 are thermocompression-bonded in the directions shown by arrow marks B in FIG. 30 so as to press the semiconductor chips 3 to the substrate 2 under slightly high temperature. The semiconductor chips 3 are thermocompression-bonded, so that the electrodes provided in the chips 3 are electrically conducted to the electrodes 6 for the chips in the substrate 2 opposed thereto by the stud bumps 11 and the conductive particles of the anisotropic conductive materials 14 and parts except the opposed electrodes are insulated. At the same time, the binder softened by heating flows round the side surfaces of the semiconductor chips 3 and the side surfaces are coated with the binder. As a result, the surfaces of the semiconductor chips 3 opposed to the substrate 2 and the side surfaces with the binder so that the semiconductor chips 3 are fixed to the substrate 2.

Figure 30:
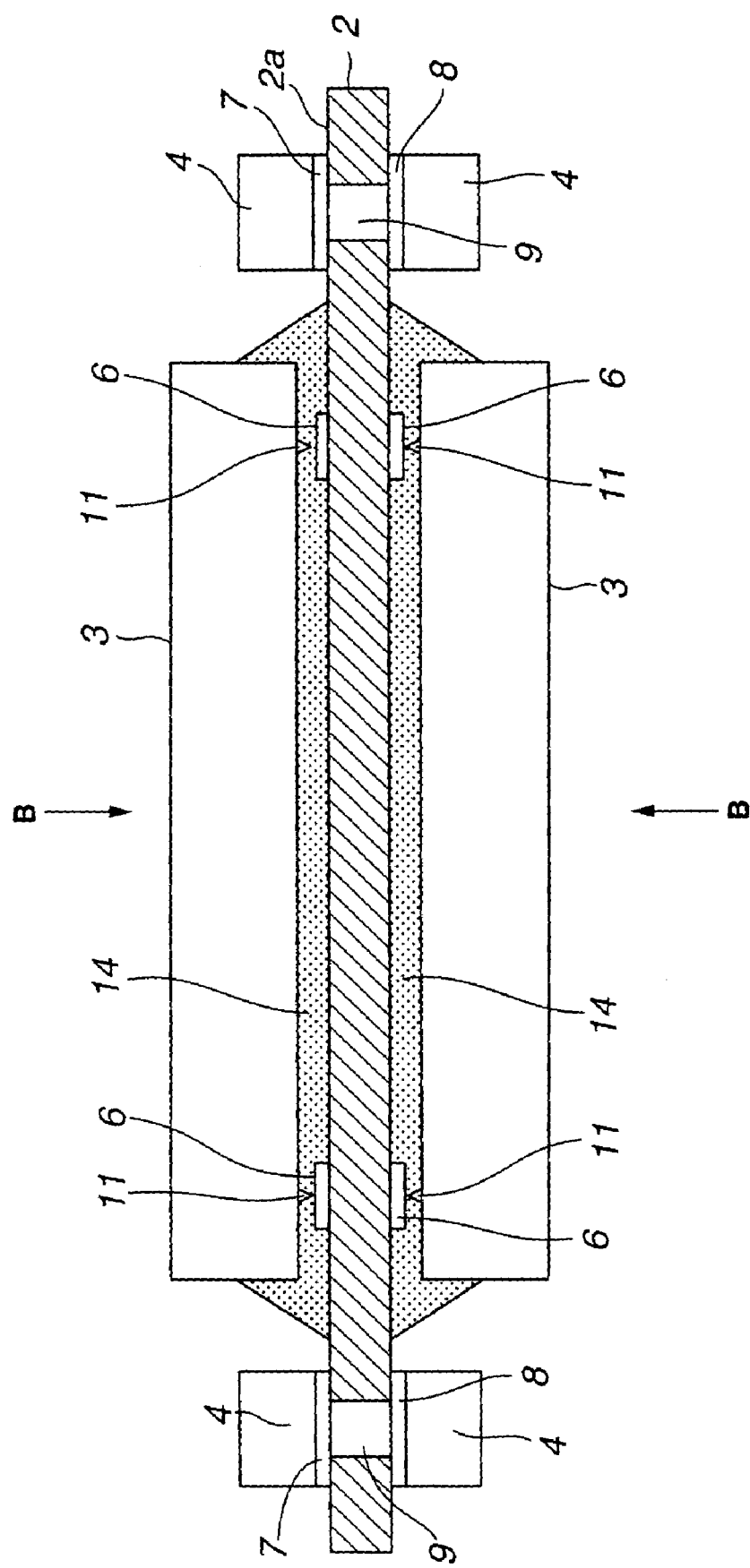

In the example shown in FIGS. 29 and 30, although the semiconductor chips 3 are mechanically fixed to the substrate 2 and electrically connected to the substrate 2 at the same time by employing the anisotropic conductive material, the present invention is not limited thereto, and other method may be used, for instance, after the semiconductor chips 3 are electrically connected to the substrate 2, the polymer material may be supplied to the parts between the semiconductor chips 3 and the substrate 2 to mechanically fix the semiconductor chips 3 to the substrate 2.

Figure 31:
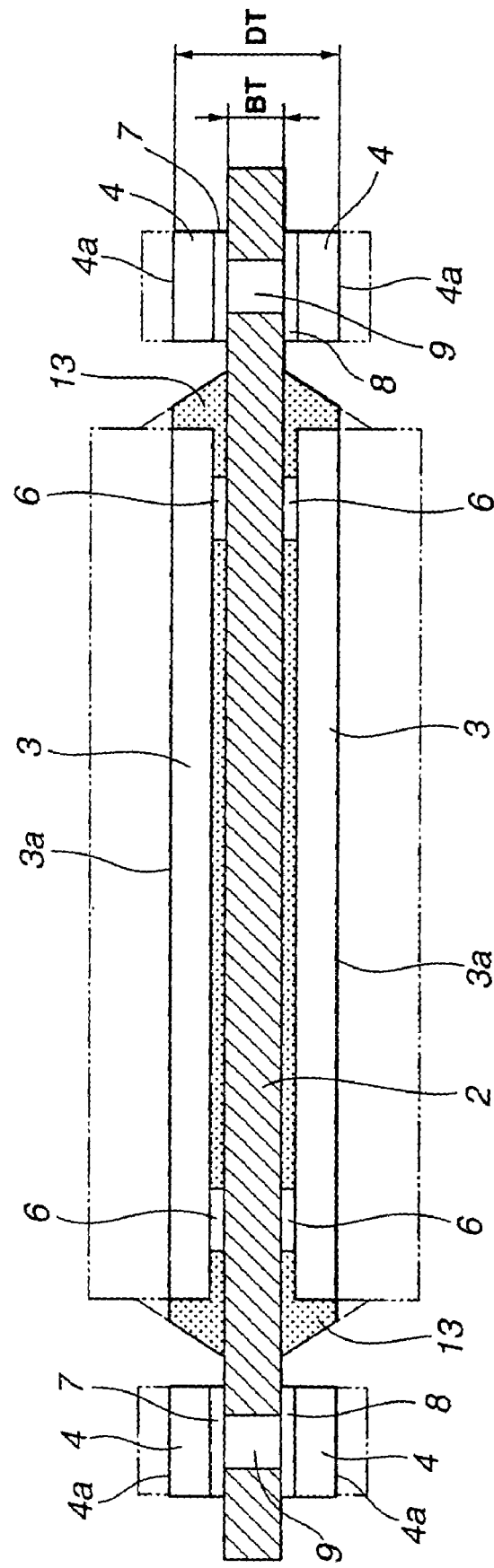

As described above, the semiconductor chips 3 mounted respectively on the surfaces 2a and 2b of the substrate 2 and the inter-substrate connecting bumps 4 formed respectively on the surfaces 2a and 2b of the substrate 2 are ground so as to have prescribed thickness from each of the surfaces 2a and 2b of the substrate 2. In the semiconductor device 1C according to the present invention, since the semiconductor chips 3 and the inter-substrate connecting bumps 4 are respectively ground so as to have desired thickness, the semiconductor device 1C shown in FIG. 31 is considered to be a completed semiconductor device mounted on an electronic device. The semiconductor device 1C shown in FIG. 31 is formed to have its thickness DT of about 0.28 mm.

The thickness of the semiconductor chip 3 after it is ground and the thickness BT of the substrate 2 are desirably set to substantially equal thickness. For instance, in the substrate 2, the thickness of a base material is set to 0.055 to 0.065 mm, the thickness of the conductor pattern including the electrodes 6, 7 and 8 is set within a range of 0.011 to 0.015 mm. The semiconductor chip 3 having the thickness of about 0.2 mm before a grinding process upon mounting on the substrate 2 is ground to have the thickness of 0.06 to 0.08 mm. The entire thickness of the semiconductor device 1C is set to about 0.28 mm.

When the semiconductor device having the semiconductor chip 3 mounted on only one surface of the substrate 2 is manufactured, the above-described steps may be respectively carried out on only one surface of the substrate 2.

Figure 32:
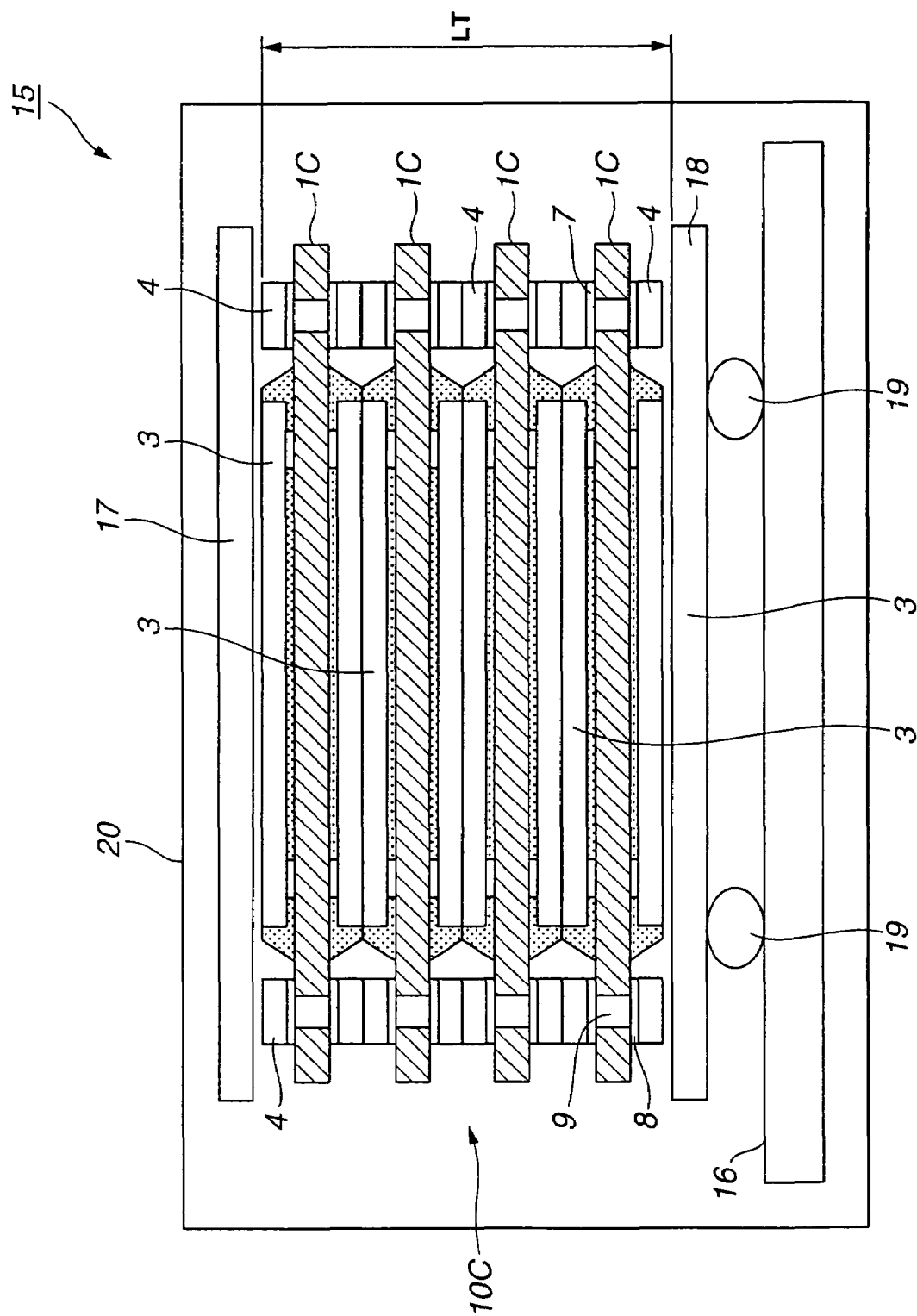
FIG. 32 is a sectional view showing a semiconductor memory device to which the fourth embodiment of the layered semiconductor device according to the present invention.

Now, as a fourth embodiment of the present invention, a layered semiconductor device 10C formed by layering the four semiconductor devices 1C and a semiconductor memory device 15 using the layered semiconductor device 10C are shown in FIG. 32.

The layered semiconductor device 10C shown in FIG. 32 is formed so as to have its thickness LT of about 1.15 mm. Before the layered semiconductor device 10C is mounted on a mother board 16, protective substrates 17 and 18 are respectively attached to upper and lower surfaces to improve a maneuverability. In the lower protective substrate 18, are formed a pattern and through holes not shown in the figure for electrically connecting the layered semiconductor device 10C to electrodes not shown on the lower surface of the protective substrate 18. The electrodes on the lower surface are formed at positions deviating from inter-substrate connecting electrodes 7 and 8 when viewed vertically in the direction of the thickness of the substrate 2.

In the semiconductor devices 1C constructed as shown in FIG. 32, a plurality of solder bumps 19 are provided on electrodes of the mother board 16 not shown in the figure, and the semiconductor devices 1C are connected to a circuit on the mother board 16 through these solder bumps 19. The mother board 16 on which the layered semiconductor device 10C is mounted is accommodated in a package 20 to form, for instance a semiconductor memory device 15. The electrodes on the lower surface of the lower protective substrate 18 are formed at the positions vertically deviating from the inter-substrate connecting electrodes 7 and 8, because the concentration of stress is avoided at the positions where the inter-substrate connecting electrodes 7 and 8 and the inter-substrate connecting bumps 4 are located when pressure is applied in the direction of thickness of the substrate 2.

Further, a layered semiconductor device in which a plurality of semiconductor devices each of which has a semiconductor chip 3 mounted on only a single surface of the substrate 2 are layered may be used to manufacture a semiconductor memory device the same as the semiconductor memory device 15 shown in FIG. 32.

The form and the structure of each part described in each embodiment show one specific example when the present invention is embodied, and therefore, they can be suitably modified without departing the gist of the present invention.

INDUSTRIAL APPLICABILITY

As described above, according to the present invention, since the semiconductor chip attached to the substrate is cut together with the encapsulating resin to have a desired thickness, load upon cutting the semiconductor chip is distributed to the encapsulating resin without concentrating the load to the semiconductor chip, the damage of the semiconductor chip such as cracks can be reduced and the semiconductor chip can be assuredly cut to have a thin form. Since the inter-substrate connecting bumps formed on the inter-substrate connecting electrodes provided on the substrate are also covered with the encapsulating resin, and then cut together with the encapsulating resin to be exposed, the imperfect connection between the inter-substrate connecting bumps and the inter-substrate connecting electrodes can be certainly prevented and the connecting end surfaces of prescribed areas of the bumps are formed.

According to the present invention, the thin semiconductor device having a storage capacity increased and high reliability can be obtained. This semiconductor device is used so that a thin semiconductor memory device having a large capacity and high reliability can be obtained.

The invention claimed is:

1. A method for manufacturing a layered semiconductor device, comprising the steps of:
    forming inter-substrate connecting bumps on one of a front surface or both of front and back surfaces of inter-substrate connecting electrodes formed on both front and back surfaces of a substrate, connected by through holes and connected to a wiring pattern, so as to be higher than a required height;
    connecting electrodes of a semiconductor chip to the wiring pattern formed on the substrate and mounting the electrodes of the semiconductor chip on the front surface or both the front and back surfaces of the substrate;
    applying an encapsulating resin to the substrate so as to cover the semiconductor chip and the inter-substrate connecting bumps therewith so as to form an encapsulated unit having a top surface and a plurality of side surfaces; and
    cutting flat the top surface of the encapsulated unit so as to have a prescribed distance between the substrate and the cut flat surfaces of the encapsulating resin, the semiconductor chip and the inter-substrate connecting bumps and cutting a number of the side surfaces where a number of through holes and the inter-substrate connecting bumps are located to expose the number of through holes and the inter-substrate connecting bumps on the number of side surfaces so that each semiconductor device is formed;
    layering a plurality of semiconductor devices; and
    connecting the inter-substrate connecting bumps of the respective semiconductor devices together or the inter-substrate connecting bumps and the inter-substrate connecting electrodes together.

2. A method f or manufacturing a semiconductor device, comprising the steps of:
    forming inter-substrate connecting bumps on one of a front surface or both of front and back surfaces of inter-substrate connecting electrodes formed on both front and back surfaces of a substrate, connected by through holes and connected to a wiring pattern, so as to be higher than a required height and making the inter-substrate connecting bumps collapse in a direction of the thickness of the substrate to have the height near the required height;
    connecting electrodes of a semiconductor chip to the wiring pattern formed on the substrate and mounting the electrodes of the semiconductor chip on the front surface or both the front and back surfaces of the substrate;
    applying a polymer material to only a portion of the semiconductor chip and the substrate so as not to cover the collapsed inter-substrate connecting bumps, the entire semiconductor chip, and the entire substrate; and
    cutting flat the surfaces of the semiconductor chip and the inter-substrate connecting bumps opposite to the substrate to have a prescribed distance between the cut flat surfaces of the semiconductor chip and the cut flat surfaces of the inter-substrate connecting bumps and the substrate.

3. The method for manufacturing a semiconductor device according to claim 2, wherein the steps of connecting the electrodes of the semiconductor chip to the wiring pattern formed on the substrate and mounting the electrodes of the semiconductor chip on the front surface or both the front and back surfaces of the substrate and applying the polymer material to only a portion of the semiconductor chip and the substrate comprise:
    mounting the semiconductor chip on the substrate by an anisotropic conductive material, and
    applying pressure and heat to the semiconductor chip so as to press the semiconductor chip to the substrate.

4. The method for manufacturing a semiconductor device according to claim 3, wherein the anisotropic conductive material is supplied in the form of a film.

5. A method for manufacturing a layered semiconductor device, comprising the steps of:
    forming inter-substrate connecting bumps on one of a front surface or both of front and back surfaces of inter-substrate connecting electrodes formed on both front and back surfaces of a substrate, connected by through holes and connected to a wiring pattern, so as to be higher than a required height;
    making the inter-substrate connecting bumps collapse in a direction of the thickness of the substrate to have a height near the required height;
    connecting electrodes of a semiconductor chip to the wiring pattern formed on the substrate and mounting the electrodes of the semiconductor chip on the front surface or both the front and back surfaces of the substrate;
    applying a polymer material to only a portion of the semiconductor chip and the substrate so as not to cover the collapsed inter-substrate connecting bumps, the entire semiconductor chip, and the entire substrate;
    cutting flat the surfaces of the semiconductor chip and the inter-substrate connecting bumps opposite to the substrate to have a prescribed distance between the cut flat surfaces of the semiconductor chip and the cut flat surfaces of the inter-substrate connecting bumps and the substrate to obtain each semiconductor device;
    layering a plurality of semiconductor devices thus obtained; and
    connecting the inter-substrate connecting bumps of the respective semiconductor devices together or connecting the inter-substrate connecting bumps to the inter-substrate connecting electrodes.

6. A method for manufacturing a layered semiconductor device having a plurality of semiconductor devices in which each semiconductor device has a substrate with front and back surfaces, a wiring circuit, a number of through holes arranged within the substrate, and a number of pairs of electrodes, each pair of electrodes having a first electrode arranged on the front surface of the substrate and a second electrode arranged on the back surface of the substrate, the first and second electrodes being electrically connected together by a respective through hole and being electrically connected to the wiring circuit, said method comprising the steps of:
    forming a connecting bump with a height higher than a final height on an upper surface of the first electrode of a respective pair of electrodes;
    connecting electrodes of a semiconductor chip to the wiring circuit and mounting the semiconductor chip on the front surface of the substrate;

applying an encapsulating resin to the front surface of the substrate so as to cover the semiconductor chip and the connecting bump so as to form an encapsulated unit having a top surface and a plurality of side surfaces; and cutting the top surface of the encapsulated unit until a distance between the front surface of the substrate and each of the cut surface of the encapsulating resin, the cut surface of the semiconductor chip, and the cut surface of the connecting bump has a predetermined value;

cutting a number of the side surfaces of the encapsulated unit at positions where a number of the through holes and the connecting bump are located such that the number of through holes and the connecting bump are exposed after cutting so as to form a semiconductor device;

arranging a plurality of semiconductor devices on top of each other; and connecting the connecting bump of one semiconductor device to the second electrode of an adjacent semiconductor device.

7. A method for manufacturing a layered semiconductor device having a plurality of semiconductor devices in which each semiconductor device has a substrate with front and back surfaces, a wiring circuit, a number of through holes arranged within the substrate, and a number of pairs of electrodes, each pair of electrodes having a first electrode arranged on the front surface of the substrate and a second electrode arranged on the back surface of the substrate, the first and second electrodes being electrically connected together by a respective through hole and being electrically connected to the wiring circuit, said method comprising the steps of:

forming a first connecting bump with a height higher than a final height on an upper surface of the first electrode of a respective pair of electrodes, and forming a second connecting bump with a height higher than the final height on an upper surface of the second electrode of the respective pair of electrodes;

connecting electrodes of a first semiconductor chip to the wiring circuit and mounting the first semiconductor chip on the front surface of the substrate;

connecting electrodes of a second semiconductor chip to the wiring circuit and mounting the second semiconductor chip on the back surface of the substrate;

applying an encapsulating resin to the front and back surfaces of the substrate so as to cover the first and second semiconductor chips and the first and second connecting bumps so as to form an encapsulated unit having a top surface, a bottom surface, and a plurality of side surfaces, in which the top surface of the encapsulated unit faces the front surface of the substrate, and the bottom surface of the encapsulated unit faces the back surface of the substrate; and cutting the top surface of the encapsulated unit until a distance between the front surface of the substrate and each of the cut surface of the encapsulating resin on the front surface of the substrate, the cut surface of the first semiconductor chip, and the cut surface of the first connecting bump has a first predetermined value, and cutting the bottom surface of the encapsulated unit until a distance between the back surface of the substrate and each of the cut surface of the encapsulating resin on the back surface of the substrate, the cut surface of the second semiconductor chip, and the cut surface of the second connecting bump has a second predetermined value so as to form a semiconductor device;

cutting a number of the side surfaces of the encapsulated unit at positions where a number of the through holes and the first and second connecting bumps are located such that the number of through holes and the first and second connecting bumps are exposed after cutting so as to form a semiconductor device;

arranging a plurality of semiconductor devices on top of each other; and connecting the first connecting bump of one semiconductor device to the second connecting bump of an adjacent semiconductor device.

8. A method for manufacturing a semiconductor device having a substrate with front and back surfaces, a wiring circuit, a number of through holes arranged within the substrate, and a number of pairs of electrodes, each pair of electrodes having a first electrode arranged on the front surface of the substrate and a second electrode arranged on the back surface of the substrate, the first and second electrodes being electrically connected together by a respective through hole and being electrically connected to the wiring circuit, said method comprising the steps of:

forming a connecting bump with a height higher than a final height on an upper surface of the first electrode of a respective pair of electrodes;

causing the connecting bump to collapse in a direction substantially perpendicular to the front surface of the substrate so as to reduce its height to that near the final height;

connecting electrodes of a semiconductor chip to the wiring circuit;

applying a polymer material to only a portion of the semiconductor chip and the front surface of the substrate so as to mount the semiconductor chip on the front surface of the substrate and so as not to cover the connecting bump, the entire semiconductor chip, and the entire front surface of the substrate; and cutting top surfaces of the semiconductor chip and the connecting bump having the reduced height until a distance between the front surface of the substrate and each of the cut surface of the semiconductor chip and the cut surface of the connecting bump has a predetermined value.

9. The method according to claim 8, further comprising the steps of:

forming a second connecting bump with a height higher than the final height on an upper surface of the second electrode of the respective pair of electrodes;

causing the second connecting bump to collapse in a direction substantially perpendicular to the back surface of the substrate so as to reduce its height to that near the final height;

connecting electrodes of a second semiconductor chip to the wiring circuit;

applying the polymer material to only a portion of the second semiconductor chip and the back surface of the substrate so as to mount the second semiconductor chip on the back surface of the substrate and so as not to cover the second connecting bump, the entire second semiconductor chip, and the entire back surface of the substrate; and cutting the top surfaces of the second semiconductor chip and the second connecting bump having the reduced height until a distance between the back surface of the substrate and each of the cut surface of the second semiconductor chip and the cut surface of the second connecting bump has a second predetermined value.

10. The method according to claim 9, wherein the first predetermined value is approximately the same as the second predetermined value.

11. The method according to claim 9, wherein the polymer material is an anisotropic conductive material, and wherein each applying step includes applying pressure and heat to the respective semiconductor chip.

12. The method according to claim 11, wherein the anisotropic conductive material has a film-like form.

13. A method for manufacturing a layered semiconductor device having a plurality of semiconductor devices in which each semiconductor device has a substrate with front and back surfaces, a wiring circuit, a number of through holes arranged within the substrate, and a number of pairs of electrodes, each pair of electrodes having a first electrode arranged on the front surface of the substrate and a second electrode arranged on the back surface of the substrate, the first and second electrodes being electrically connected together by a respective through hole and being electrically connected to the wiring circuit, said method comprising the steps of:

forming a connecting bump with a height higher than a final height on an upper surface of the first electrode of a respective pair of electrodes;

causing the connecting bump to collapse in a direction substantially perpendicular to the front surface of the substrate so as to reduce its height to that near the final height;

connecting electrodes of a semiconductor chip to the wiring circuit;

applying a polymer material to only a portion of the semiconductor chip and the front surface of the substrate so as to mount the semiconductor chip on the front surface of the substrate and so as not to cover the connecting bump, the entire semiconductor chip, and the entire front surface of the substrate; and cutting top surfaces of the semiconductor chip and the connecting bump having the reduced height until a distance between the front surface of the substrate and each of the cut surface of the semiconductor chip and the cut surface of the connecting bump has a predetermined value so as to obtain a semiconductor device;

arranging a plurality of semiconductor devices on top of each other; and connecting the connecting bump of one semiconductor device to the second electrode of an adjacent semiconductor device.

14. A method for manufacturing a layered semiconductor device having a plurality of semiconductor devices in which each semiconductor device has a substrate with front and back surfaces, a wiring circuit, a number of through holes arranged within the substrate, and a number of pairs of electrodes, each pair of electrodes having a first electrode arranged on the front surface of the substrate and a second electrode arranged on the back surface of the substrate, the first and second electrodes being electrically connected together by a respective through hole and being electrically connected to the wiring circuit, said method comprising the steps of:

forming a first connecting bump with a height higher than a final height on an upper surface of the first electrode of a respective pair of electrodes;

forming a second connecting bump with a height higher than the final height on an upper surface of the second electrode of the respective pair of electrodes;

causing the first and second connecting bumps to collapse in a direction substantially perpendicular to the front and back surfaces of the substrate so as to reduce the height thereof to that near the final height;

connecting electrodes of a first semiconductor chip to the wiring circuit;

applying a polymer material to only a portion of the first semiconductor chip and the front surface of the substrate so as to mount the first semiconductor chip on the front surface of the substrate and so as not to cover the first connecting bump, the entire first semiconductor chip, and the entire front surface of the substrate;

connecting electrodes of a second semiconductor chip to the wiring circuit;

applying the polymer to only a portion of the second semiconductor chip and the back surface of the substrate so as to mount the second semiconductor chip on the back surface of the substrate and so as not to cover the second connecting bump, the entire second semiconductor chip, and the entire back surface of the substrate;

cutting top surfaces of the first semiconductor chip and the first connecting bump having the reduced height until a distance between the front surface of the substrate and each of the cut surface of the first semiconductor chip and the cut surface of the first connecting bump has a first predetermined value, and cutting top surfaces of the second semiconductor chip and the second connecting bump having the reduced height until a distance between the back surface of the substrate and each of the cut surface of the second semiconductor chip and the cut surface of the second connecting bump has a second predetermined value so as to form a semiconductor device;

arranging a plurality of semiconductor devices on top of each other; and connecting the first connecting bump of one semiconductor device to the second connecting bump of an adjacent semiconductor device.

* * * * *

UNITED STATES PATENT AND TRADEMARK OFFICE
CERTIFICATE OF CORRECTION

PATENT NO. : 7,071,028 B2
APPLICATION NO. : 10/381633
DATED : July 4, 2006
INVENTOR(S) : Toshihiko Koike, Manabu Honda and Masuo Kato It is certified that error appears in the above-identified patent and that said Letters Patent is hereby corrected as shown below:

\*\*TITLE PAGE, Item (54), "SEMICONDUCTOR DEVICE AND ITS MANUFACTURING METHOD" should read -- SEMICONDUCTOR DEVICE AND ITS METHOD FOR MANUFACTURING IT. --

TITLE PAGE, Item (57), should read --The present invention relates to a semiconductor device having a semiconductor chip (3) mounted on a substrate (2) and includes a substrate having inter-substrate connecting electrodes (7) and (8) formed on both front and back surfaces and connected by through holes (9); a semiconductor chip having electrodes connected to a wiring pattern formed on the substrate and a surface opposite to an electrode firming surface cut flat; inter-substrate connecting bumps (4) provided on the inter-substrate connecting electrodes on the substrate and having surfaces opposite to the substrate cut flat; and an encapsulating resin (5) provided on the substrate to encapsulate the semiconductor chip and the inter-substrate connecting bumps and having surfaces opposite to the substrate cut flat. The cut flat surface (3a) of the semiconductor chip, the cut flat surfaces (4a) of the inter-substrate connecting bumps and the cut flat surfaces (5a) of the encapsulating resin are located in the same plane and the semiconductor chip and the inter-substrate connecting bumps are encapsulated in the encapsulating resin except the cut flat surfaces.--

Column 1, line 1, "SEMICONDUCTOR DEVICE AND ITS MANUFACTURING METHOD" should read -- SEMICONDUCTOR DEVICE AND ITS METHOD FOR MANUFACTURING IT.--
Column 1, line 45, "the substrate 104, are" should read --the substrate 104 are--.
Column 3, line 38, "semiconductor device, are" should read --semiconductor device are--.
Column 4, line 25, "connecting bump are" should read --connecting bumps are--.
Column 5, line 42, "invention, each" should read --invention is presented. Each--.
Column 6, line 58, "method for method for manufacturing" should read --method for manufacturing--.
Column 7, line 26, "still another objects" should read --still other objects--.
Column 8, line 30, "memory device to which the fourth embodiment of the layered semiconductor device according to the present invention." should read --memory device according to the fourth embodiment of the present invention.--
Column 10, line 35, "7, are" should read --7 are--.
Column 15, line 52, "into firmly and tightly" should read --into firm and tight--.
Column 16, line 24, "process is performed" should read --process are performed--.
Column 16, line 28, "dome shaped" should read --dome-shaped--.
Column 16, line 34, "a presecribed" should read --a prescribed--.

UNITED STATES PATENT AND TRADEMARK OFFICE
CERTIFICATE OF CORRECTION

PATENT NO. : 7,071,028 B2
APPLICATION NO. : 10/381633
DATED : July 4, 2006
INVENTOR(S) : Toshihiko Koike, Manabu Honda and Masuo Kato It is certified that error appears in the above-identified patent and that said Letters Patent is hereby corrected as shown below:

Column 17, line 42, "method" should read --methods--.
Column 19, line 42, "method f or" should read --method for--.

Signed and Sealed this

Fourth Day of September, 2007

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 7,071,028 B2 |
| APPLICATION NO. | : 10/381633 |
| DATED | : July 4, 2006 |
| INVENTOR(S) | : Toshihiko Koike, Manabu Honda and Masuo Kato |

It is certified that error appears in the above-identified patent and that said Letters Patent is hereby corrected as shown below:

**TITLE PAGE, Item (54), "SEMICONDUCTOR DEVICE AND ITS MANUFACTURING METHOD" should read -- SEMICONDUCTOR DEVICE AND ITS METHOD FOR MANUFACTURING IT. --

TITLE PAGE, Item (57), should read --The present invention relates to a semiconductor device having a semiconductor chip (3) mounted on a substrate (2) and includes a substrate having inter-substrate connecting electrodes (7) and (8) formed on both front and back surfaces and connected by through holes (9); a semiconductor chip having electrodes connected to a wiring pattern formed on the substrate and a surface opposite to an electrode forming surface cut flat; inter-substrate connecting bumps (4) provided on the inter-substrate connecting electrodes on the substrate and having surfaces opposite to the substrate cut flat; and an encapsulating resin (5) provided on the substrate to encapsulate the semiconductor chip and the inter-substrate connecting bumps and having surfaces opposite to the substrate cut flat. The cut flat surface (3a) of the semiconductor chip, the cut flat surfaces (4a) of the inter-substrate connecting bumps and the cut flat surfaces (5a) of the encapsulating resin are located in the same plane and the semiconductor chip and the inter-substrate connecting bumps are encapsulated in the encapsulating resin except the cut flat surfaces.--

Column 1, line 1, "SEMICONDUCTOR DEVICE AND ITS MANUFACTURING METHOD" should read -- SEMICONDUCTOR DEVICE AND ITS METHOD FOR MANUFACTURING IT.--
Column 1, line 45, "the substrate 104, are" should read --the substrate 104 are--.
Column 3, line 38, "semiconductor device, are" should read --semiconductor device are--.
Column 4, line 25, "connecting bump are" should read --connecting bumps are--.
Column 5, line 42, "invention, each" should read --invention is presented. Each--.
Column 6, line 58, "method for method for manufacturing" should read --method for manufacturing--.
Column 7, line 26, "still another objects" should read --still other objects--.
Column 8, line 30, "memory device to which the fourth embodiment of the layered semiconductor device according to the present invention." should read --memory device according to the fourth embodiment of the present invention.--
Column 10, line 35, "7, are" should read --7 are--.
Column 15, line 52, "into firmly and tightly" should read --into firm and tight--.
Column 16, line 24, "process is performed" should read --process are performed--.
Column 16, line 28, "dome shaped" should read --dome-shaped--.
Column 16, line 34, "a presecribed" should read --a prescribed--.

UNITED STATES PATENT AND TRADEMARK OFFICE
CERTIFICATE OF CORRECTION

PATENT NO. : 7,071,028 B2
APPLICATION NO. : 10/381633
DATED : July 4, 2006
INVENTOR(S) : Toshihiko Koike, Manabu Honda and Masuo Kato It is certified that error appears in the above-identified patent and that said Letters Patent is hereby corrected as shown below:

Column 17, line 42, "method" should read --methods--.
Column 19, line 42, "method f or" should read --method for--.

This certificate supersedes Certificate of Correction issued September 4, 2007.

Signed and Sealed this

Eighteenth Day of December, 2007

JON W. DUDAS
*Director of the United States Patent and Trademark Office*